(12) United States Patent
Van Weperen et al.

(10) Patent No.: US 12,298,257 B2
(45) Date of Patent: May 13, 2025

(54) MONOLITHIC PARTICLE INSPECTION DEVICE

(71) Applicants: ASML Netherlands B.V., Veldhoven (NL); ASML Holding N.V., Veldhoven (NL)

(72) Inventors: Ilse Van Weperen, Veldhoven (NL); Arjan Johannes Anton Beukman, Son en Breugel (NL); Mohamed Swillam, Wilton, CT (US); Justin Lloyd Kreuzer, Trumbull, CT (US); Stephen Roux, New Fairfield, CT (US)

(73) Assignee: ASML Netherlands B.V., Veldhoven (NL)

( * ) Notice: Subject to any disclaimer, the term of this patent is extended or adjusted under 35 U.S.C. 154(b) by 268 days.

(21) Appl. No.: 18/012,801

(22) PCT Filed: Jun. 9, 2021

(86) PCT No.: PCT/EP2021/065540
§ 371 (c)(1),
(2) Date: Dec. 23, 2022

(87) PCT Pub. No.: WO2021/259646
PCT Pub. Date: Dec. 30, 2021

(65) Prior Publication Data
US 2023/0266255 A1 Aug. 24, 2023

Related U.S. Application Data

(60) Provisional application No. 63/197,194, filed on Jun. 4, 2021, provisional application No. 63/043,543, filed on Jun. 24, 2020.

(51) Int. Cl.
*G01N 21/956* (2006.01)

(52) U.S. Cl.
CPC . *G01N 21/956* (2013.01); *G01N 2021/95676* (2013.01)

(58) Field of Classification Search
CPC .............. G01N 21/47; G01N 21/8806; G01N 2021/95676; G01N 21/956; G03F 1/84; G03F 7/70616
See application file for complete search history.

(56) References Cited

U.S. PATENT DOCUMENTS 6,297,876 B1  10/2001  Bornebroek
6,639,201 B2* 10/2003  Almogy ............. G01N 21/8806
                                                  250/208.1

(Continued)

FOREIGN PATENT DOCUMENTS

EP    1 372 040 B1    12/2003
TW    2019-40871 A    10/2019

(Continued)

OTHER PUBLICATIONS

International Search Report and Written Opinion of the International Searching Authority directed to International Patent Application No. PCT/EP2021/065540, mailed Oct. 18, 2021; 9 pages.

(Continued)

*Primary Examiner* — Sang H Nguyen
(74) *Attorney, Agent, or Firm* — Sterne, Kessler, Goldstein & Fox P.L.L.C.

(57) ABSTRACT

Systems, apparatuses, and methods are provided for detecting a particle on a substrate surface. An example method can include receiving, by a grating structure, coherent radiation from a radiation source. The method can further include generating, by the grating structure, a focused coherent radiation beam based on the coherent radiation. The method can further include transmitting, by the grating structure, the focused coherent radiation beam toward a region of a surface of a substrate. The method can further include (Continued)

receiving, by the grating structure, photons scattered from the region in response to illuminating the region with the focused coherent radiation beam. The method can further include measuring, by a photodetector, the photons received by the grating structure. The method can further include generating, by the photodetector and based on the measured photons, an electronic signal for detecting a particle located in the region of the surface of the substrate.

13 Claims, 8 Drawing Sheets

(56) References Cited

U.S. PATENT DOCUMENTS

| | | | |
|---|---|---|---|
| 6,952,253 B2 | 10/2005 | Lof et al. | |
| 7,511,799 B2 | 3/2009 | Tel et al. | |
| 9,588,421 B2 | 3/2017 | Takehisa et al. | |
| 10,126,237 B2* | 11/2018 | Van Der Zouw | G01N 21/956 |
| 10,338,013 B1 | 7/2019 | Brodie et al. | |
| 2003/0085335 A1* | 5/2003 | Almogy | G01N 21/9501 |
| | | | 250/208.1 |
| 2003/0206292 A1* | 11/2003 | Some | G01N 21/636 |
| | | | 356/237.1 |
| 2007/0153265 A1 | 7/2007 | Vaez-Iravani et al. | |
| 2007/0228274 A1* | 10/2007 | Elyasaf | H01J 37/29 |
| | | | 250/306 |
| 2009/0080085 A1* | 3/2009 | Botma | G02B 27/144 |
| | | | 359/629 |
| 2014/0210983 A1* | 7/2014 | Shimura | G02B 21/361 |
| | | | 348/80 |
| 2018/0136568 A1* | 5/2018 | Roobol | G01N 21/47 |
| 2018/0267411 A1* | 9/2018 | Srivastava | H01S 3/00 |
| 2019/0086824 A1 | 3/2019 | Mathijssen et al. | |
| 2020/0089135 A1 | 3/2020 | Goorden et al. | |
| 2020/0124977 A1* | 4/2020 | D'Achard Van Enschut | |
| | | | G03F 7/7065 |

FOREIGN PATENT DOCUMENTS

| | | |
|---|---|---|
| WO | WO 2000/026646 A1 | 5/2000 |
| WO | WO 2020/043582 A1 | 3/2020 |

OTHER PUBLICATIONS

International Preliminary Report on Patentability directed to International Patent Application No. PCT/EP2021/065540, issued Dec. 13, 2022; 7 pages.
International Search Report and Written Opinion of the International Searching Authority directed to International Patent Application No. PCT/EP2021/065537, mailed Nov. 5, 2021; 11 pages.
International Preliminary Report on Patentability directed to International Patent Application No. PCT/EP2021/065537, issued Dec. 13, 2022; 8 pages.

* cited by examiner

MONOLITHIC PARTICLE INSPECTION DEVICE

CROSS-REFERENCE TO RELATED APPLICATIONS

This application claims priority of U.S. Provisional Patent Application No. 63/043,543, which was filed on Jun. 24, 2020, and of U.S. Provisional Patent Application No. 63/197,194, which was filed on Jun. 4, 2021, both of which are incorporated herein in their entirety by reference.

TECHNICAL FIELD

The present disclosure relates to particle inspection devices that may be used, for example, in metrology systems.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is interchangeably referred to as a mask or a reticle, can be used to generate a circuit pattern to be formed on an individual layer of the IC being formed. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Traditional lithographic apparatuses include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel (e.g., opposite) to this scanning direction. It is also possible to transfer the pattern from the patterning device to the substrate by imprinting the pattern onto the substrate.

As semiconductor manufacturing processes continue to advance, the dimensions of circuit elements have continually been reduced while the amount of functional elements, such as transistors, per device has been steadily increasing over decades, following a trend commonly referred to as Moore's law. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

Extreme ultraviolet (EUV) radiation, for example, electromagnetic radiation having wavelengths of around 50 nanometers (nm) or less (also sometimes referred to as soft x-rays), and including light at a wavelength of about 13.5 nm, can be used in or with a lithographic apparatus to produce extremely small features in or on substrates, for example, silicon wafers. A lithographic apparatus which uses EUV radiation having a wavelength within a range of 4 nm to 20 nm, for example 6.7 nm or 13.5 nm, can be used to form smaller features on a substrate than a lithographic apparatus which uses, for example, radiation with a wavelength of 193 nm.

Methods to produce EUV light include, but are not necessarily limited to, converting a material that has an element, for example, xenon (Xe), lithium (Li), or tin (Sn), with an emission line in the EUV range to a plasma state. For example, in one such method called laser produced plasma (LPP), the plasma can be produced by irradiating a target material, which is interchangeably referred to as fuel in the context of LPP sources, for example, in the form of a droplet, plate, tape, stream, or cluster of material, with an amplified light beam that can be referred to as a drive laser. For this process, the plasma is typically produced in a sealed vessel, for example, a vacuum chamber, and monitored using various types of metrology equipment.

Within the environment of the lithographic apparatus, highly dynamic processes take place, e.g., reticle hand-off, wafer hand-off, controlled gas flows, outgassing of vacuum chamber walls, liquid dispensing (e.g., photoresist coating), temperature variations, metal deposition, rapid movement of numerous actuatable components, and wear of structures. Over time, dynamic processes introduce and build up contaminant particles within the lithographic apparatus. Such contamination may include the presence of particles on the surface of the lithographic patterning device which may affect the etching of the pattern itself and/or subsequent inaccuracies in the patterning process, which may result in damaged and/or non-performing circuits.

Additionally, during an inspection operation, light reflected off of an illuminated pattern may produce a false positive detection indicating to the detector that a particle is present in a location where, in actuality, it is not. False positives can be detrimental to lithography. For example, a false positive detection can slow down production by unnecessarily prompting a maintenance action (e.g., reticle replacement) or even recommending discarding a perfectly conforming reticle. Moreover, such signals may also interfere with other light signals received from the particle at a backside of the lithographic patterning device.

SUMMARY

The present disclosure describes various aspects of systems, apparatuses, and methods for detecting a particle on a substrate surface.

In some aspects, the present disclosure describes a system. The system can include a radiation source configured to generate coherent radiation. The system can further include a grating structure optically coupled to the radiation source and configured to receive the coherent radiation from the radiation source, generate a focused coherent radiation beam based on the coherent radiation, transmit the focused coherent radiation beam toward a region of a surface of a substrate, and receive photons scattered from the region in response to an illumination of the region by the focused coherent radiation beam. The system can further include a photodetector optically coupled to the grating structure and configured to measure the photons received by the grating structure and generate, based on the measured photons, an electronic signal for use in detecting a particle located in the region of the surface of the substrate. In some aspects, the grating structure can include a plurality of regions, and the photodetector can be configured to measure a plurality of sets of photons received by the plurality of regions and generate the electronic signal based on the measured plurality of sets of photons, where each set of photons in the plurality of sets of photons has been received by a respective region of the grating structure.

In some aspects, the system can further include a plurality of grating structures and a plurality of photodetectors. Each grating structure can be optically coupled to the radiation source and configured to receive a respective portion of the coherent radiation from the radiation source, generate a respective focused coherent radiation beam based on the respective portion of the coherent radiation, transmit the respective focused coherent radiation beam toward a respective region of the surface of the substrate, and receive respective photons scattered from the respective region in response to a respective illumination of the respective region by the respective focused coherent radiation beam. Each photodetector can be optically coupled to a respective grating structure and configured to measure the respective photons received by the respective grating structure and generate, based on the measured photons, a respective electronic signal for use in detecting a particle located in the region of the surface of the substrate.

In some aspects, the present disclosure describes an integrated optical device. The integrated optical device can include a grating structure optically coupled to the radiation source and configured to receive the coherent radiation from the radiation source, generate a focused coherent radiation beam based on the coherent radiation, transmit the focused coherent radiation beam toward a region of a surface of a substrate, and receive photons scattered from the region in response to an illumination of the region by the focused coherent radiation beam. The integrated optical device can further include a photodetector optically coupled to the grating structure and configured to measure the photons received by the grating structure and generate, based on the measured photons, an electronic signal for use in detecting a particle located in the region of the surface of the substrate. In some aspects, the grating structure can include a plurality of regions, and the photodetector can be configured to measure a plurality of sets of photons received by the plurality of regions and generate the electronic signal based on the measured plurality of sets of photons, where each set of photons in the plurality of sets of photons has been received by a respective region of the grating structure.

In some aspects, the integrated optical device can further include a plurality of grating structures and a plurality of photodetectors. Each grating structure can be optically coupled to the radiation source and configured to receive a respective portion of the coherent radiation from the radiation source, generate a respective focused coherent radiation beam based on the respective portion of the coherent radiation, transmit the respective focused coherent radiation beam toward a respective region of the surface of the substrate, and receive respective photons scattered from the respective region in response to a respective illumination of the respective region by the respective focused coherent radiation beam. Each photodetector can be optically coupled to a respective grating structure and configured to measure the respective photons received by the respective grating structure and generate, based on the measured photons, a respective electronic signal for use in detecting a particle located in the region of the surface of the substrate.

In some aspects, the present disclosure describes a monolithic inspection device (e.g., a single-chip integrated optical particle inspection device). The monolithic inspection device can include a receiver configured to receive coherent radiation from a radiation source. The monolithic inspection device can further include a focusing structure (e.g., a grating structure, a lensing grating structure, or any other suitable structure or combination of structures) optically coupled to the receiver and configured to generate a focused coherent radiation beam based on the coherent radiation, transmit the focused coherent radiation beam toward a region of a surface of a substrate, and receive photons scattered from the region in response to an illumination of the region by the focused coherent radiation beam. The monolithic inspection device can further include a photodetector optically coupled to the focusing structure and configured to measure the photons received by the focusing structure and generate, based on the measured photons, an electronic signal for use in detecting a particle located in the region of the surface of the substrate. In some aspects, the focusing structure can include a plurality of regions, and the photodetector can be configured to measure a plurality of sets of photons received by the plurality of regions and generate the electronic signal based on the measured plurality of sets of photons, where each set of photons in the plurality of sets of photons has been received by a respective region of the focusing structure.

In some aspects, the monolithic inspection device can further include a plurality of focusing structures and a plurality of photodetectors. Each focusing structure can be optically coupled to the radiation source and configured to receive a respective portion of the coherent radiation from the radiation source, generate a respective focused coherent radiation beam based on the respective portion of the coherent radiation, transmit the respective focused coherent radiation beam toward a respective region of the surface of the substrate, and receive respective photons scattered from the respective region in response to a respective illumination of the respective region by the respective focused coherent radiation beam. Each photodetector can be optically coupled to a respective focusing structure and configured to measure the respective photons received by the respective focusing structure and generate, based on the measured photons, a respective electronic signal for use in detecting a particle located in the region of the surface of the substrate.

In some aspects, the present disclosure describes a method for detecting a particle on a substrate surface. The method can include receiving, by a grating structure, coherent radiation from a radiation source. The method can further include generating, by the grating structure, a focused coherent radiation beam based on the coherent radiation. The method can further include transmitting, by the grating structure, the focused coherent radiation beam toward a region of a surface of a substrate. The method can further include receiving, by the grating structure, photons scattered from the region in response to illuminating the region with the focused coherent radiation beam. The method can further include measuring, by a photodetector, the photons received by the grating structure. The method can further include generating, by the photodetector and based on the measured photons, an electronic signal for use in detecting a particle located in the region of the surface of the substrate. In some aspects, the grating structure can include a plurality of regions, and the method can further include receiving, by the plurality of regions of the grating structure, a plurality of sets of photons scattered from the region in response to illuminating the region with the focused coherent radiation beam, where each set of photons in the plurality of sets of photons has been received by a respective region of the grating structure. In such aspects, the method can further include measuring, by the photodetector, the plurality of sets of photons received by the plurality of regions. In such aspects, the method can further include generating, by the photodetector, the electronic signal based on the measured plurality of sets of photons.

In some aspects, the method can further include receiving, by each grating structure in a plurality of grating structures that includes the grating structure, a respective portion of the coherent radiation from the radiation source. In such aspects, the method can further include generating, by each grating structure in the plurality of grating structures, a respective focused coherent radiation beam based on the respective portion of the coherent radiation. In such aspects, the method can further include transmitting, by each grating structure in the plurality of grating structures, the respective focused coherent radiation beam toward a respective region of the surface of the substrate. In such aspects, the method can further include receiving, by each grating structure in the plurality of grating structures, respective photons scattered from the respective region in response to illuminating the respective region with the respective focused coherent radiation beam. In such aspects, the method can further include measuring, by each photodetector in a plurality of photodetectors that includes the photodetector, the respective photons received by the respective grating structure. In such aspects, the method can further include generating, by each photodetector in the plurality of photodetectors and based on the measured photons, a respective electronic signal for use in detecting a particle located in the region of the surface of the substrate.

Further features, as well as the structure and operation of various aspects, are described in detail below with reference to the accompanying drawings. It is noted that the disclosure is not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS

The accompanying drawings, which are incorporated herein and form part of the specification, illustrate the present disclosure and, together with the description, further serve to explain the principles of the aspects of this disclosure and to enable a person skilled in the relevant art(s) to make and use the aspects of this disclosure.

Figure 1A:
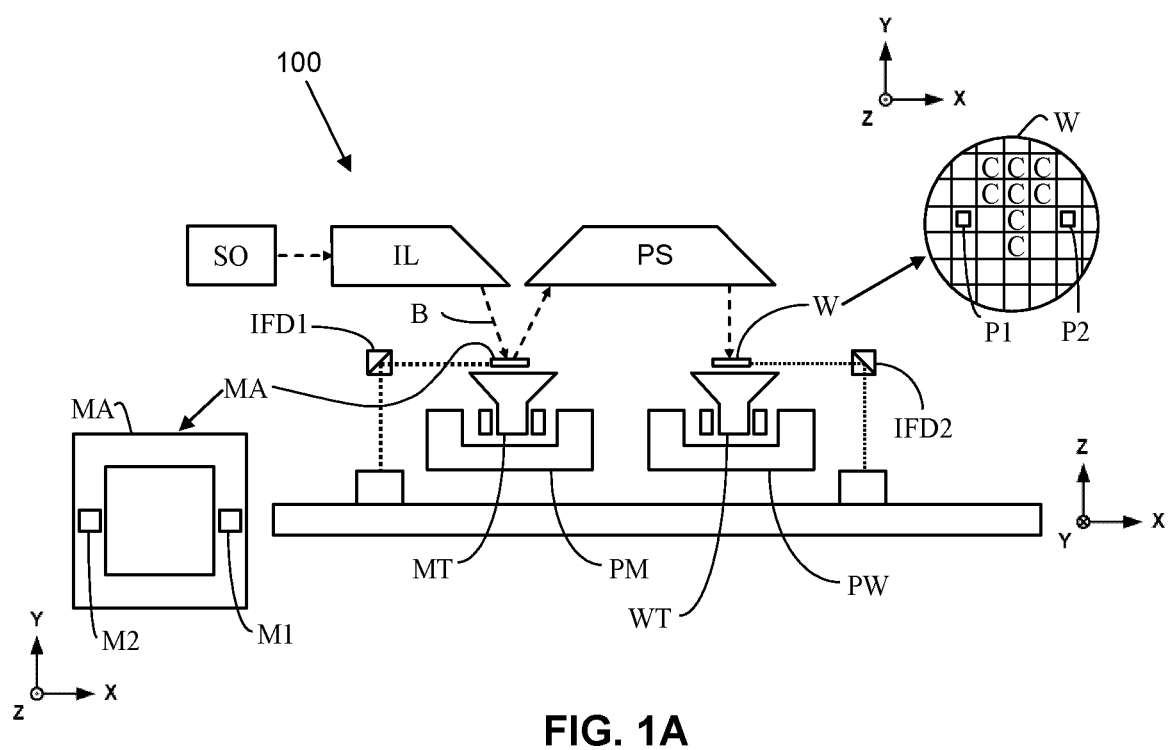
FIG. 1A is a schematic illustration of an example reflective lithographic apparatus according to some aspects of the present disclosure.

The features and advantages of the present disclosure will become more apparent from the detailed description set forth below when taken in conjunction with the drawings, in which like reference characters identify corresponding elements throughout. In the drawings, unless otherwise indicated, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of the present disclosure. The disclosed embodiment(s) merely describe the present disclosure. The scope of the disclosure is not limited to the disclosed embodiment(s). The breadth and scope of the disclosure are defined by the claims appended hereto and their equivalents.

The embodiment(s) described, and references in the specification to "one embodiment," "an embodiment," "an example embodiment," etc., indicate that the embodiment(s) described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device can be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

The term "integrated optical device" as used herein refers to a monolithic device or IC, such as a single-chip particle inspection device having optical elements integrated on a single chip. In the integrated optical devices described herein, light can be guided by waveguides molded out of the chip. The waveguides can include Si, SiN (e.g., $Si_3N_4$), InP, AlN, $TiO_2$, $LiNbO_3$, any other suitable material, or any combination thereof, depending on the operational wavelength range of the integrated optical device. In some embodiments, SiN can support an operating wavelength range from about 0.3 micrometers (μm or microns) to about 5.5 μm, AlN can support an operating wavelength range from about 0.2 μm to about 13.6 μm, and Si can support an operating wavelength range from about 1.1 µm to about 6.5 µm. While materials such as the ones mentioned above can support a broad range of wavelengths, the geometry (e.g., width and height) of some of the waveguides disclosed herein may reduce their operating wavelength ranges to smaller wavelength ranges (e.g., a few nanometers). In some aspects, the integrated optical devices described herein can increase stability due to their small and monolithic design. Additionally, optical modules in the integrated optical devices described herein can be aligned by design (e.g., using lithography) to reduce or substantially eliminate device-to-device differences. In some aspects, the term "monolithic device" can refer to a single-chip device. For example, the term "monolithic inspection device" can refer to a single-chip integrated optical particle inspection device.

Overview

Some aspects of the present disclosure can provide an inspection tool that includes multiple grating structures (e.g., lensing grating structures) in which the optical elements are provided on a single chip. In some aspects, incoming light (e.g., coherent radiation at 400 nm), provided by a laser, can be coupled into the chip via a fiber-to-grating coupling. The incoming light can reach the grating structures via waveguides. Each grating structure can consist of a grating with variable line spacing so as to focus the light (e.g., "lensing"). Subsequently, the light scattered by the sample under inspection can be collected through the same grating structure. Each grating structure can be separated into four regions to obtain a differential signal from the scattered light. Multiple grating structures in parallel, provided in an array or checkerboard-like pattern, can allow inspection of a larger area in a single scanning movement.

In some aspects, the present disclosure provides for creating a pencil-shaped beam through the use of a one-dimensional focusing element (e.g., lensing grating structure), such that in a single scanning movement a larger area can be inspected. In such embodiments, the lensing grating structure can be adjusted so as to act as a phased optical array, which can allow sideways movement of the beam as it is scanned, and therefore can allow inspection of even a larger surface in a single scan. If the throughput improvement provided by a single pencil-like beam shape is not sufficient, an array of lensing grating structures may be provided to increase the throughput.

There are many exemplary aspects to the systems, apparatuses, methods, and computer program products disclosed herein. For example, aspects of the present disclosure provide for utilizing a single operating wavelength (e.g., 400 nm, 1.1 µm) to allow for the use of integrated optics having materials (e.g., silicon nitride ($Si_3N_4$), Si) suitable for the operating wavelength. In another example, aspects of the present disclosure provide for utilizing integrated optics and improved metrological techniques in inspection tools. Compared to bulk optics, integrated optics present a simple and cost-effective way to achieve parallelization. For example, the use of approximately 10 parallel units would enable reasonable inspection times (e.g., 30 minutes per wafer, 100 minutes per reticle) for patterned surfaces. For bare surfaces, an inspection tool having about 100 parallel units (e.g., lensing grating structures and related waveguides and balanced photodetectors) can be utilized. As a result of the techniques described in the present disclosure, sufficient throughput can be obtained for optical inspection of areas with sizes relevant for IC-production (e.g., reticle area, wafer area) down to small feature sizes (e.g., small particles). Additionally, the techniques described in the present disclosure can be used in combination with an electron beam (e-beam) system for hybrid inspection (e.g., initially perform optical inspection and then only use e-beam inspection for potentially contaminated or otherwise deviant areas).

Before describing such aspects in more detail, however, it is instructive to present an example environment in which aspects of the present disclosure can be implemented.

Example Lithographic Systems

Figure 1B:
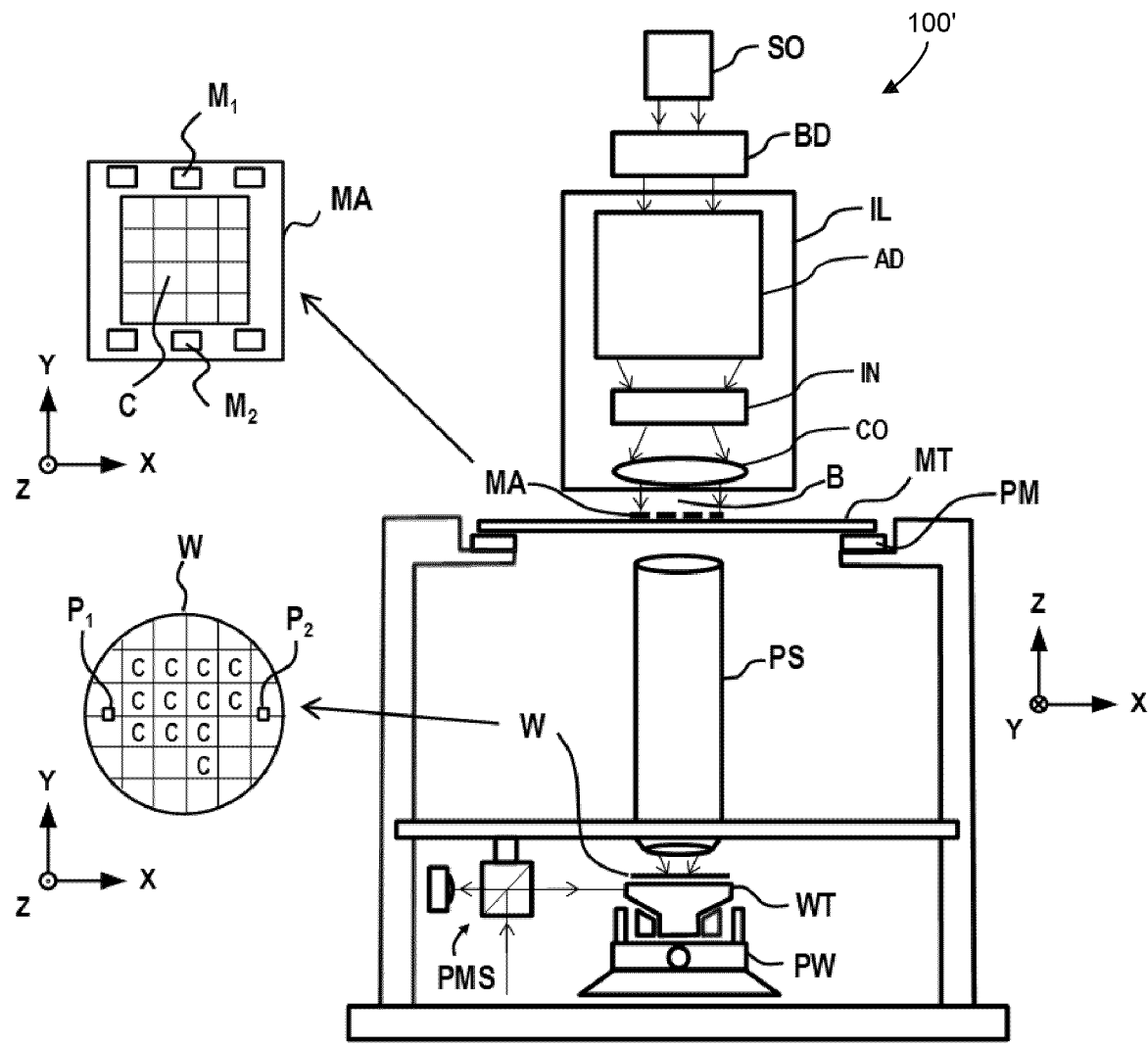
FIG. 1B is a schematic illustration of an example transmissive lithographic apparatus according to some aspects of the present disclosure.

FIGS. 1A and 1B are schematic illustrations of a lithographic apparatus 100 and a lithographic apparatus 100', respectively, in which aspects of the present disclosure can be implemented. As shown in FIGS. 1A and 1B, the lithographic apparatuses 100 and 100' are illustrated from a point of view (e.g., a side view) that is normal to the XZ plane (e.g., the X-axis points to the right, the Z-axis points upward, and the Y-axis points into the page away from the viewer), while the patterning device MA and the substrate W are presented from additional points of view (e.g., a top view) that are normal to the XY plane (e.g., the X-axis points to the right, the Y-axis points upward, and the Z-axis points out of the page toward the viewer).

In some aspects, the lithographic apparatus 100 and/or the lithographic apparatus 100' can include one or more of the following structures: an illumination system IL (e.g., an illuminator) configured to condition a radiation beam B (e.g., a deep ultra violet (DUV) radiation beam or an extreme ultra violet (EUV) radiation beam); a support structure MT (e.g., a mask table) configured to support a patterning device MA (e.g., a mask, a reticle, or a dynamic patterning device) and connected to a first positioner PM configured to accurately position the patterning device MA; and, a substrate holder such as a substrate table WT (e.g., a wafer table) configured to hold a substrate W (e.g., a resist-coated wafer) and connected to a second positioner PW configured to accurately position the substrate W. Lithographic apparatuses 100 and 100' also have a projection system PS (e.g., a refractive projection lens system) configured to project a pattern imparted to the radiation beam B by patterning device MA onto a target portion C (e.g., a portion including one or more dies) of the substrate W. In lithographic apparatus 100, the patterning device MA and the projection system PS are reflective. In lithographic apparatus 100', the patterning device MA and the projection system PS are transmissive.

In some aspects, in operation, the illumination system IL can receive a radiation beam from a radiation source SO (e.g., via a beam delivery system BD shown in FIG. 1B). The illumination system IL can include various types of optical structures, such as refractive, reflective, catadioptric, magnetic, electromagnetic, electrostatic, and other types of optical components, or any combination thereof, for directing, shaping, or controlling radiation. In some aspects, the illumination system IL can be configured to condition the radiation beam B to have a desired spatial and angular intensity distribution in its cross-section at a plane of the patterning device MA.

In some aspects, the support structure MT can hold the patterning device MA in a manner that depends on the orientation of the patterning device MA with respect to a reference frame, the design of at least one of the lithographic apparatuses 100 and 100', and other conditions, such as whether or not the patterning device MA is held in a vacuum environment. The support structure MT can use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

In some aspects, the patterning device MA can be transmissive (as in lithographic apparatus 100' of FIG. 1B) or reflective (as in lithographic apparatus 100 of FIG. 1A). The patterning device MA can include various structures such as reticles, masks, programmable mirror arrays, programmable LCD panels, other suitable structures, or combinations thereof. Masks can include mask types such as binary, alternating phase shift, or attenuated phase shift, as well as various hybrid mask types. In one example, a programmable mirror array can include a matrix arrangement of small mirrors, each of which can be individually tilted so as to reflect an incoming radiation beam in different directions. The tilted mirrors can impart a pattern in the radiation beam B, which is reflected by a matrix of small mirrors.

The term "projection system" PS should be interpreted broadly and can encompass any type of projection system, including refractive, reflective, catadioptric, magnetic, anamorphic, electromagnetic, and electrostatic optical systems, or any combination thereof, as appropriate for the exposure radiation being used, and/or for other factors such as the use of an immersion liquid (e.g., on the substrate W) or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps. In addition, any use herein of the term "projection lens" can be interpreted, in some aspects, as synonymous with the more general term "projection system" PS.

In some aspects, the lithographic apparatus 100 and/or the lithographic apparatus 100' can be of a type having two (e.g., "dual stage") or more substrate tables WT and/or two or more mask tables). In such "multiple stage" machines, the additional substrate tables WT can be used in parallel, or preparatory steps can be carried out on one or more tables while one or more other substrate tables WT are being used for exposure. In one example, steps in preparation of a subsequent exposure of the substrate W can be carried out on the substrate W located on one of the substrate tables WT while another substrate W located on another of the substrate tables WT is being used for exposing a pattern on another substrate W. In some aspects, the additional table may not be a substrate table WT.

In some aspects, in addition to the substrate table WT, the lithographic apparatus 100 and/or the lithographic apparatus 100' can include a measurement stage. The measurement stage can be arranged to hold a sensor. The sensor can be arranged to measure a property of the projection system PS, a property of the radiation beam B, or both. In some aspects, the measurement stage can hold multiple sensors. In some aspects, the measurement stage can move beneath the projection system PS when the substrate table WT is away from the projection system PS.

In some aspects, the lithographic apparatus 100 and/or the lithographic apparatus 100' can also be of a type wherein at least a portion of the substrate can be covered by a liquid having a relatively high refractive index, e.g., water, so as to fill a space between the projection system PS and the substrate W. An immersion liquid can also be applied to other spaces in the lithographic apparatus, for example, between the patterning device MA and the projection system PS Immersion techniques provide for increasing the numerical aperture of projection systems. The term "immersion" as used herein does not mean that a structure, such as a substrate, must be submerged in liquid, but rather only means that liquid is located between the projection system and the substrate during exposure. Various immersion techniques are described in U.S. Pat. No. 6,952,253, issued Oct. 4, 2005, and titled "LITHOGRAPHIC APPARATUS AND DEVICE MANUFACTURING METHOD," which is incorporated by reference herein in its entirety.

Referring to FIGS. 1A and 1B, the illumination system IL receives a radiation beam B from a radiation source SO. The radiation source SO and the lithographic apparatus 100 or 100' can be separate physical entities, for example, when the radiation source SO is an excimer laser. In such cases, the radiation source SO is not considered to form part of the lithographic apparatus 100 or 100', and the radiation beam B passes from the radiation source SO to the illumination system IL with the aid of a beam delivery system BD (e.g., shown in FIG. 1B) including, for example, suitable directing mirrors and/or a beam expander. In other cases, the radiation source SO can be an integral part of the lithographic apparatus 100 or 100', for example, when the radiation source SO is a mercury lamp. The radiation source SO and the illuminator IL, together with the beam delivery system BD, if required, can be referred to as a radiation system.

In some aspects, the illumination system IL can include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illumination system IL can include various other components, such as an integrator IN and a radiation collector CO (e.g., a condenser or collector optic). In some aspects, the illumination system IL can be used to condition the radiation beam B to have a desired uniformity and intensity distribution in its cross section.

Referring to FIG. 1A, in operation, the radiation beam B can be incident on the patterning device MA (e.g., a mask, reticle, programmable mirror array, programmable LCD panel, any other suitable structure or combination thereof), which can be held on the support structure MT (e.g., a mask table), and can be patterned by the pattern (e.g., design layout) present on the patterning device MA. In lithographic apparatus 100, the radiation beam B can be reflected from the patterning device MA. Having traversed (e.g., after being reflected from) the patterning device MA, the radiation beam B can pass through the projection system PS, which can focus the radiation beam B onto a target portion C of the substrate W or onto a sensor arranged at a stage.

In some aspects, with the aid of the second positioner PW and position sensor IFD2 (e.g., an interferometric device, linear encoder, or capacitive sensor), the substrate table WT can be moved accurately, e.g., so as to position different target portions C in the path of the radiation beam B. Similarly, the first positioner PM and another position sensor IFD1 (e.g., an interferometric device, linear encoder, or capacitive sensor) can be used to accurately position the patterning device MA with respect to the path of the radiation beam B.

In some aspects, patterning device MA and substrate W can be aligned using mask alignment marks M1 and M2 and substrate alignment marks P1 and P2. Although FIGS. 1A and 1B illustrate the substrate alignment marks P1 and P2 as occupying dedicated target portions, the substrate alignment marks P1 and P2 may be located in spaces between target portions. Substrate alignment marks P1 and P2 are known as scribe-lane alignment marks when they are located between the target portions C. Substrate alignment marks P1 and P2 can also be arranged in the target portion C area as in-die marks. These in-die marks can also be used as metrology marks, for example, for overlay measurements.

In some aspects, for purposes of illustration and not limitation, one or more of the figures herein can utilize a Cartesian coordinate system. The Cartesian coordinate system includes three axes: an X-axis; a Y-axis; and a Z-axis. Each of the three axes is orthogonal to the other two axes (e.g., the X-axis is orthogonal to the Y-axis and the Z-axis, the Y-axis is orthogonal to the X-axis and the Z-axis, the Z-axis is orthogonal to the X-axis and the Y-axis). A rotation around the X-axis is referred to as an Rx-rotation. A rotation around the Y-axis is referred to as an Ry-rotation. A rotation around about the Z-axis is referred to as an Rz-rotation. In some aspects, the X-axis and the Y-axis define a horizontal plane, whereas the Z-axis is in a vertical direction. In some aspects, the orientation of the Cartesian coordinate system may be different, for example, such that the Z-axis has a component along the horizontal plane. In some aspects, another coordinate system, such as a cylindrical coordinate system, can be used.

Referring to FIG. 1B, the radiation beam B is incident on the patterning device MA, which is held on the support structure MT, and is patterned by the patterning device MA. Having traversed the patterning device MA, the radiation beam B passes through the projection system PS, which focuses the beam onto a target portion C of the substrate W. In some aspects, the projection system PS can have a pupil conjugate to an illumination system pupil. In some aspects, portions of radiation can emanate from the intensity distribution at the illumination system pupil and traverse a mask pattern without being affected by diffraction at the mask pattern MP and create an image of the intensity distribution at the illumination system pupil.

The projection system PS projects an image MP' of the mask pattern MP, where image MP' is formed by diffracted beams produced from the mask pattern MP by radiation from the intensity distribution, onto a resist layer coated on the substrate W. For example, the mask pattern MP can include an array of lines and spaces. A diffraction of radiation at the array and different from zeroth-order diffraction generates diverted diffracted beams with a change of direction in a direction perpendicular to the lines. Reflected light (e.g., zeroth-order diffracted beams) traverses the pattern without any change in propagation direction. The zeroth-order diffracted beams traverse an upper lens or upper lens group of the projection system PS, upstream of the pupil conjugate of the projection system PS, to reach the pupil conjugate. The portion of the intensity distribution in the plane of the pupil conjugate and associated with the zeroth-order diffracted beams is an image of the intensity distribution in the illumination system pupil of the illumination system IL. In some aspects, an aperture device can be disposed at, or substantially at, a plane that includes the pupil conjugate of the projection system PS.

The projection system PS is arranged to capture, by means of a lens or lens group, not only the zeroth-order diffracted beams, but also first-order or first- and higher-order diffracted beams (not shown). In some aspects, dipole illumination for imaging line patterns extending in a direction perpendicular to a line can be used to utilize the resolution enhancement effect of dipole illumination. For example, first-order diffracted beams interfere with corresponding zeroth-order diffracted beams at the level of the substrate W to create an image of the mask pattern MP at highest possible resolution and process window (e.g., usable depth of focus in combination with tolerable exposure dose deviations). In some aspects, astigmatism aberration can be reduced by providing radiation poles (not shown) in opposite quadrants of an illumination system pupil. Further, in some aspects, astigmatism aberration can be reduced by blocking the zeroth-order beams in the pupil conjugate of the projection system PS associated with radiation poles in opposite quadrants. This is described in more detail in U.S. Pat. No. 7,511,799, issued Mar. 31, 2009, and titled "LITHOGRAPHIC PROJECTION APPARATUS AND A DEVICE MANUFACTURING METHOD," which is incorporated by reference herein in its entirety.

In some aspects, with the aid of the second positioner PW and a position measurement system PMS (e.g., including a position sensor such as an interferometric device, linear encoder, or capacitive sensor), the substrate table WT can be moved accurately, e.g., so as to position different target portions C in the path of the radiation beam B at a focused and aligned position. Similarly, the first positioner PM and another position sensor (e.g., an interferometric device, linear encoder, or capacitive sensor) (not shown in FIG. 1B) can be used to accurately position the patterning device MA with respect to the path of the radiation beam B (e.g., after mechanical retrieval from a mask library or during a scan). Patterning device MA and substrate W can be aligned using mask alignment marks M1 and M2 and substrate alignment marks P1 and P2.

In general, movement of the support structure MT can be realized with the aid of a long-stroke positioner (coarse positioning) and a short-stroke positioner (fine positioning), which form part of the first positioner PM. Similarly, movement of the substrate table WT can be realized using a long-stroke positioner and a short-stroke positioner, which form part of the second positioner PW. In the case of a stepper (as opposed to a scanner), the support structure MT can be connected to a short-stroke actuator only or can be fixed. Patterning device MA and substrate W can be aligned using mask alignment marks M1 and M2, and substrate alignment marks P1 and P2. Although the substrate alignment marks (as illustrated) occupy dedicated target portions, they can be located in spaces between target portions (e.g., scribe-lane alignment marks) Similarly, in situations in which more than one die is provided on the patterning device MA, the mask alignment marks M1 and M2 can be located between the dies.

Support structure MT and patterning device MA can be in a vacuum chamber V, where an in-vacuum robot can be used to move patterning devices such as a mask in and out of vacuum chamber. Alternatively, when support structure MT and patterning device MA are outside of the vacuum chamber, an out-of-vacuum robot can be used for various transportation operations, similar to the in-vacuum robot. In some instances, both the in-vacuum and out-of-vacuum robots need to be calibrated for a smooth transfer of any payload (e.g., a mask) to a fixed kinematic mount of a transfer station.

In some aspects, the lithographic apparatuses 100 and 100' can be used in at least one of the following modes:

1. In step mode, the support structure MT and the substrate table WT are kept essentially stationary, while an entire pattern imparted to the radiation beam B is projected onto a target portion C at one time (e.g., a single static exposure). The substrate table WT is then shifted in the X and/or Y direction so that a different target portion C can be exposed.

2. In scan mode, the support structure MT and the substrate table WT are scanned synchronously while a pattern imparted to the radiation beam B is projected onto a target portion C (e.g., a single dynamic exposure). The velocity and direction of the substrate table WT relative to the support structure MT (e.g., mask table) can be determined by the (de-)magnification and image reversal characteristics of the projection system PS.

3. In another mode, the support structure MT is kept substantially stationary holding a programmable patterning device MA, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device MA, such as a programmable mirror array.

In some aspects, the lithographic apparatuses 100 and 100' can employ combinations and/or variations of the above-described modes of use or entirely different modes of use.

In some aspects, as shown in FIG. 1A, the lithographic apparatus 100 can include an EUV source configured to generate an EUV radiation beam B for EUV lithography. In general, the EUV source can be configured in a radiation source SO, and a corresponding illumination system IL can be configured to condition the EUV radiation beam B of the EUV source.

Figure 2:
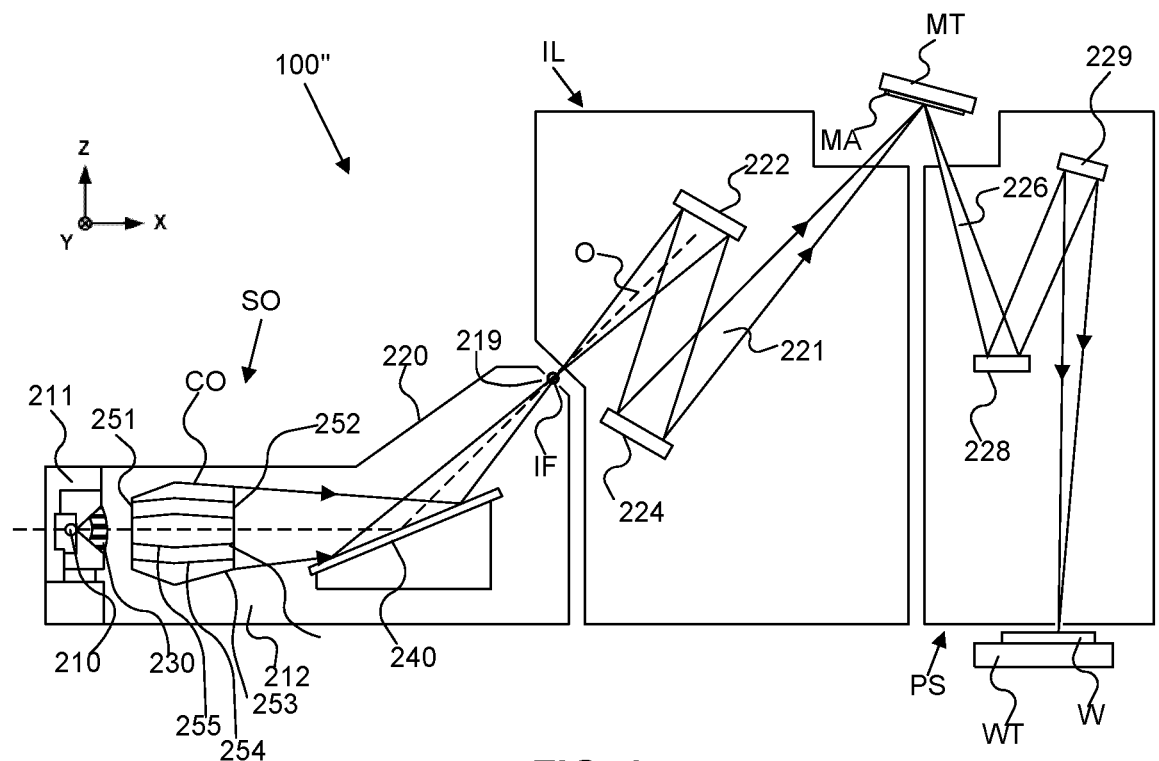
FIG. 2 is a more detailed schematic illustration of the reflective lithographic apparatus shown in FIG. 1A according to some aspects of the present disclosure.

FIG. 2 shows the lithographic apparatus 100 in more detail, including the radiation source SO (e.g., a source collector apparatus), the illumination system IL, and the projection system PS. As shown in FIG. 2, the lithographic apparatus 100 is illustrated from a point of view (e.g., a side view) that is normal to the XZ plane (e.g., the X-axis points to the right and the Z-axis points upward).

The radiation source SO is constructed and arranged such that a vacuum environment can be maintained in an enclosing structure 220. The radiation source SO includes a source chamber 211 and a collector chamber 212 and is configured to produce and transmit EUV radiation. EUV radiation can be produced by a gas or vapor, for example xenon (Xe) gas, lithium (Li) vapor, or tin (Sn) vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, about 10.0 pascals (Pa) of Xe gas, Li vapor, Sn vapor, or any other suitable gas or vapor can be used for efficient generation of the radiation. In some aspects, a plasma of excited tin is provided to produce EUV radiation.

The radiation emitted by the EUV radiation emitting plasma 210 is passed from the source chamber 211 into the collector chamber 212 via an optional gas barrier or contaminant trap 230 (e.g., in some cases also referred to as contaminant barrier or foil trap), which is positioned in or behind an opening in the source chamber 211. The contaminant trap 230 can include a channel structure. Contaminant trap 230 can also include a gas barrier or a combination of a gas barrier and a channel structure. The contaminant trap 230 further indicated herein at least includes a channel structure.

The collector chamber 212 can include a radiation collector CO (e.g., a condenser or collector optic), which can be a so-called grazing incidence collector. Radiation collector CO has an upstream radiation collector side 251 and a downstream radiation collector side 252. Radiation that traverses radiation collector CO can be reflected off a grating spectral filter 240 to be focused in a virtual source point IF. The virtual source point IF is commonly referred to as the intermediate focus, and the source collector apparatus is arranged such that the virtual source point IF is located at or near an opening 219 in the enclosing structure 220. The virtual source point IF is an image of the EUV radiation emitting plasma 210. The grating spectral filter 240 can be used to suppress infrared (IR) radiation.

Subsequently the radiation traverses the illumination system IL, which can include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the radiation beam 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown can generally be present in illumination system IL and projection system PS. Optionally, the grating spectral filter 240 can be present depending upon the type of lithographic apparatus. Further, there can be more mirrors present than those shown in the FIG. 2. For example, there can be one to six additional reflective elements present in the projection system PS than shown in FIG. 2.

Radiation collector CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a radiation collector CO of this type is preferably used in combination with a discharge produced plasma (DPP) source.

Example Lithographic Cell

Figure 3:
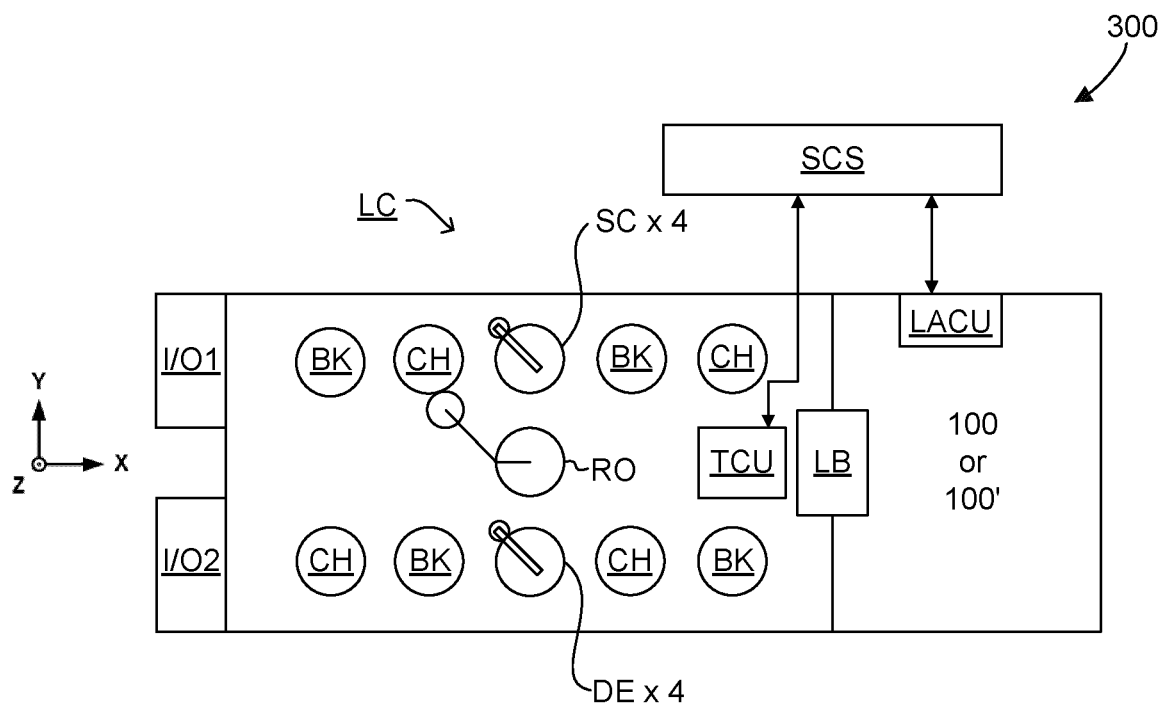
FIG. 3 is a schematic illustration of an example lithographic cell according to some aspects of the present disclosure.

FIG. 3 shows a lithographic cell 300, also sometimes referred to a lithocell or cluster. As shown in FIG. 3, the lithographic cell 300 is illustrated from a point of view (e.g., a top view) that is normal to the XY plane (e.g., the X-axis points to the right and the Y-axis points upward).

Lithographic apparatus 100 or 100' can form part of lithographic cell 300. Lithographic cell 300 can also include one or more apparatuses to perform pre- and post-exposure processes on a substrate. For example, these apparatuses can include spin coaters SC to deposit resist layers, developers DE to develop exposed resist, chill plates CH, and bake plates BK. A substrate handler RO (e.g., a robot) picks up substrates from input/output ports I/O1 and I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Example Particle Inspection Systems

Figure 4:
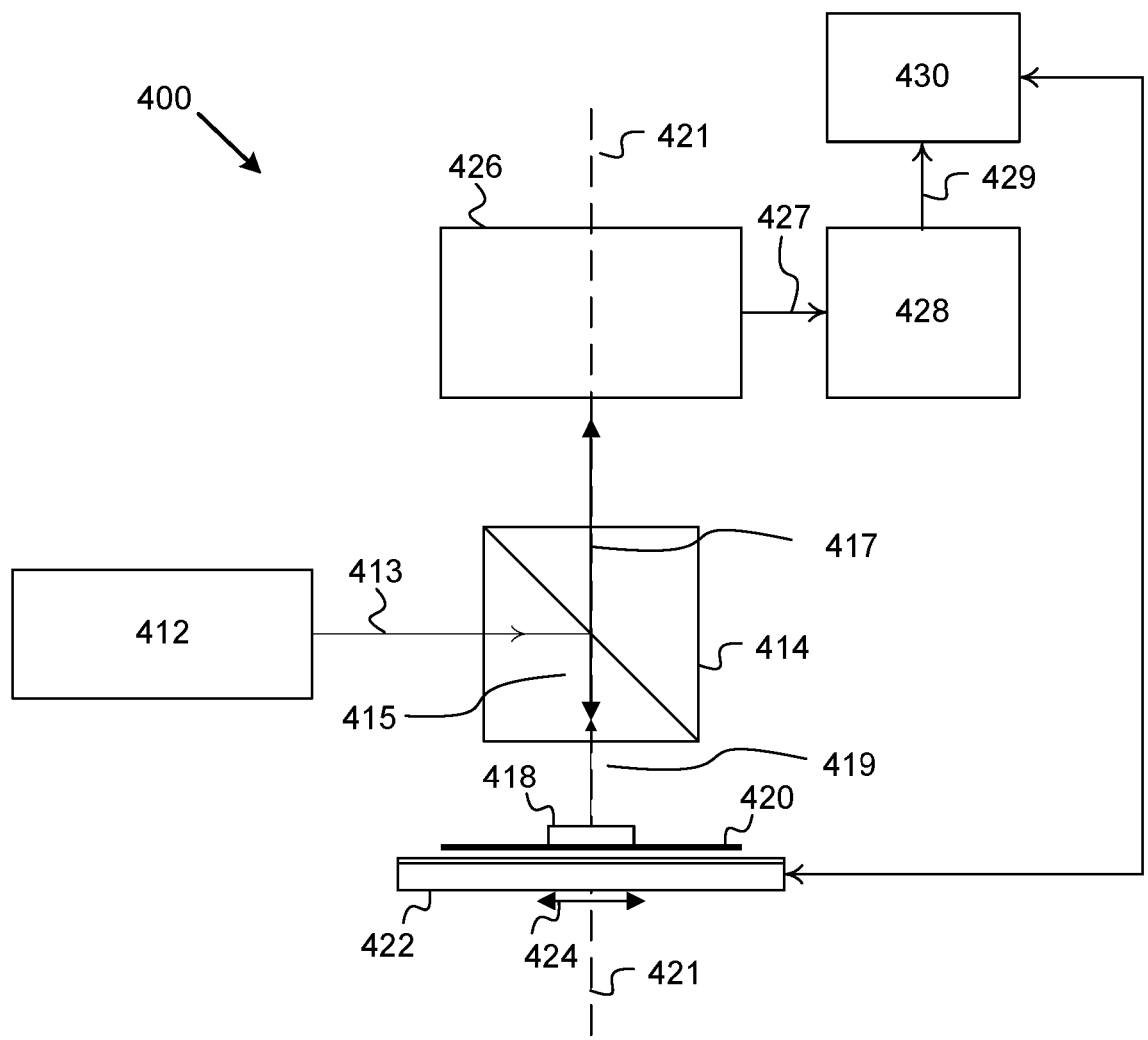
FIG. 4 is a schematic illustration of an example particle inspection system, according to some aspects of the present disclosure.

FIG. 4 illustrates a schematic of a cross-sectional view of a particle inspection system 400 that can be implemented as a part of lithographic apparatus 100 or 100', according to an embodiment. In an example of this embodiment, particle inspection system 400 may be configured to align a substrate (e.g., substrate W) with respect to a patterning device (e.g., patterning device MA). Particle inspection system 400 may be further configured to detect positions of alignment marks on the substrate and to align the substrate with respect to the patterning device or other components of lithography apparatus 100 or 100' using the detected positions of the alignment marks. Such alignment of the substrate may ensure accurate exposure of one or more patterns on the substrate.

According to an embodiment, particle inspection system 400 may include an illumination system 412, a reflector 414 (or, additionally or alternatively, a grating structure such as a lensing grating), an interferometer 426, a detector 428 (e.g., a balanced photodetector), and a controller 430, according an example of this embodiment. Illumination system 412 may be configured to provide a radiation beam 413. Radiation beam 413 may include, for example, an electromagnetic narrow band having one or more passbands. In another example, the one or more passbands may be discrete narrow passbands within a spectrum of wavelengths between about 350 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current particle inspection systems. And, as a result, the use of constant CWL values may increase long-term stability and accuracy of particle inspection systems (e.g., particle inspection system 400) compared to the current particle inspection systems.

Reflector 414 may be configured to receive radiation beam 413 and direct radiation beam 413 towards substrate 420 as radiation beam 415, according an embodiment. Reflector 414 may be a mirror or dichromatic mirror. In one example, stage 422 is moveable along direction 424. Radiation beam 415 may be configured to illuminate a plurality of alignment marks 418 or targets located on substrate 420. In another example, radiation beam 415 is configured to reflect from a surface of substrate 420. The plurality of alignment marks 418 may be coated with a radiation sensitive film in an example of this embodiment. In another example, the plurality of alignment marks 418 may have one hundred and eighty degree symmetry. That is, when one alignment mark in the plurality of alignment marks 418 is rotated one hundred and eighty degrees about an axis of symmetry perpendicular to a plane of another alignment mark in the plurality of alignment marks 418, the rotated alignment mark may be substantially identical to the un-rotated alignment mark.

As illustrated in FIG. 4, interferometer 426 may be configured to receive radiation beam 417. A radiation beam 419 may be diffracted from the plurality of alignment marks 418, or reflected from a surface of substrate 420, and is received at interferometer 426 as radiation beam 417. Interferometer 426 can include any appropriate set of optical and/or electro-optical elements, for example, a combination of prisms that may be configured to form two images of the plurality of alignment marks 418 based on the received radiation beam 417. It should be appreciated that a good quality image need not be formed, but that the features of the plurality of alignment marks 418 should be resolved. Interferometer 426 may be further configured to rotate one of the two images with respect to the other of the two images one hundred and eighty degrees and recombine the two images interferometrically.

In an embodiment, detector 428 may be configured to receive the recombined image and detect an interference as a result of the recombined image when alignment axis 421 of particle inspection system 400 passes through a center of symmetry (not shown) of the plurality of alignment marks 418. Such interference may be due to the plurality of alignment marks 418 being one hundred and eighty degree symmetrical, and the recombined image interfering constructively or destructively, according to an example embodiment. Based on the detected interference, detector 428 may be further configured to determine a position of the center of symmetry of the plurality of alignment marks 418 and consequently, detect a position of substrate 420. According to an example, alignment axis 421 may be aligned with an optical beam perpendicular to substrate 420 and passing through a center of image rotation interferometer 426. In another example, detector 428 is configured to receive the recombined image and detect an interference of light being reflected off a surface of substrate 420.

In a further embodiment, controller 430 may be configured to receive a measurement data signal 429 including measurement data. Measurement data can include, but is not limited to, electronic information indicative of the determined center of symmetry. Controller 430 may be further configured to determine a position of stage 422 and correlate the position of stage 422 with the position of the center of symmetry of the plurality of alignment marks 418. As such, the positions of the plurality of alignment marks 418 and consequently, the position of substrate 420 may be accurately determined with reference to stage 422. Alternatively, controller 430 may be configured to determine a position of particle inspection system 400 or any other reference element such that the center of symmetry of the plurality of alignment marks 418 may be determined with reference to particle inspection system 400 or any other reference element.

In an embodiment, controller 430 is configured to apply a correction to a measurement received from detector 428 to account for asymmetry that can exist in the plurality of alignment marks 418. The asymmetry can exist due to imperfections in the structure of the mark itself (e.g., sidewall angle, critical dimension spacing, etc.) or due to non-linear optical effects based on the wavelength of light being directed towards the plurality of alignment marks 418.

It should be noted that even though reflector 414 is shown to direct radiation beam 413 towards the plurality of alignment marks 418 as radiation beam 415, the disclosure is not so limiting. It would be apparent to a person skilled in the relevant art that other optical arrangements may be used to obtain the similar result of illuminating the plurality of alignment marks 418 on substrate 420 and detecting an image of the plurality of alignment marks 418. Reflector 414 may direct the illumination in a direction normal to the surface of substrate 420, or at an angle.

Figure 5:
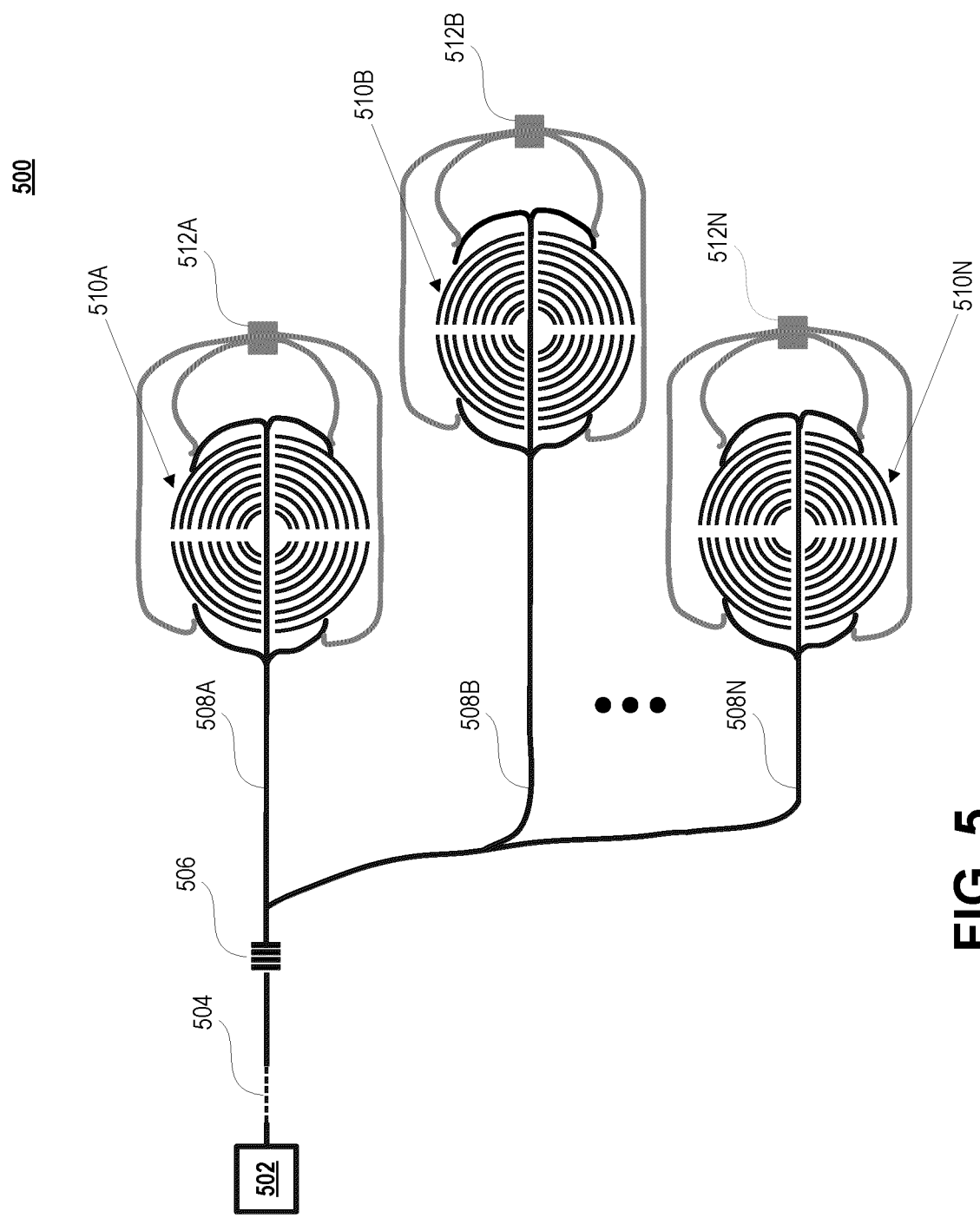
FIG. 5 is a schematic illustration of another example particle inspection system, according to some aspects of the present disclosure.

FIG. 5 is a schematic illustration showing a plan view (e.g., a bottom view) of a particle inspection system 500 according to some aspects of the present disclosure. In some aspects, the particle inspection system 500, or any portion thereof, can be implemented using any of the structures, components, features, or techniques described with reference to the particle inspection system 400 described with reference to FIG. 4; the particle inspection system 600 described with reference to FIG. 6; the example computing system 800 described with reference to FIG. 8; any of the systems, structures, components, features, or techniques described in U.S. Provisional Patent Application No. 63/043,543, filed Jun. 24, 2020, and titled "Self-Referencing Integrated Alignment Sensor," which is hereby incorporated by reference in its entirety; any other suitable structure, component, feature, or technique; any portion thereof; or any combination thereof.

As shown in FIG. 5, the particle inspection system 500 can include a radiation source 502 (e.g., a laser source), a fiber 504, a fiber-to-grating coupling 506, waveguides 508A-508N, lensing grating structures 510A-510N, balanced photodetectors 512A-512N, and a controller (not depicted). In some aspects, the particle inspection system 500 can be an integrated optics parallel inspection system. In some aspects, some, or all, of the components shown in FIG. 5 can be disposed in a single-chip, $Si_3N_4$-based particle inspection device. In one illustrative and non-limiting example, the fiber-to-grating coupling 506, waveguides 508A-508N, lensing grating structures 510A-510N, and balanced photodetectors 512A-512N can be provided on a single chip.

The radiation source 502 can be configured to generate coherent radiation (e.g., having a wavelength of about 400 nm) and transmit the coherent radiation through the fiber 504 to the fiber-to-grating coupling 506 and then through a respective one of the waveguides 508A-508N to a respective one of the lensing grating structures 510A-510N (e.g., through waveguide 508A to lensing grating structure 510A, through waveguide 508B to lensing grating structure 510B, through waveguide 508N to lensing grating structure 510N).

Each of the lensing grating structures 510A-510N can be optically coupled to the radiation source 502 through a respective one of the waveguides 508A-508N, the fiber-to-grating coupling 506, and the fiber 504 (and/or freespace).

The lensing grating structures 510A-510N can be configured to receive the coherent radiation from the radiation source 502, generate focused coherent radiation beams based on the coherent radiation, and transmit the focused coherent radiation beams toward multiple regions of a surface of a substrate for use in particle inspection and other metrological techniques. In response to illuminating the regions by the focused coherent radiation beams, the lensing grating structures 510A-510N can be configured to receive photons scattered from the regions and transmit the received photons to the balanced photodetectors 512A-512N.

Each of the balanced photodetectors 512A-512N can be optically coupled (e.g., via four channels such as waveguides) to each of the four quadrants of a respective one of the lensing grating structures 510A-510N, as shown in FIG. 5. Each of the balanced photodetectors 512A-512N can be configured to measure the photons received by a respective one of the lensing grating structures 510A-510N and generate, based on the measured photons, an electronic signal for use in detecting a particle located in the region of the surface of the substrate. Additionally or alternatively, each of the balanced photodetectors 512A-512N can be configured to generate an optical signal based on the measured photons to allow for faster data processing. In some aspects, each of the lensing grating structures 510A-510N can include a plurality of regions (e.g., four quadrants), and each of the balanced photodetectors 512A-512N can measure a plurality of sets of photons (e.g., four sets of photons) received by the plurality of regions (e.g., a first set of photons for the first quadrant, a second set of photons for the second quadrant, a third set of photons for the third quadrant, a fourth set of photons for the fourth quadrant) and generate the electronic signal based on the measured sets of photons, where each set of photons in the plurality of sets of photons has been received by a respective region of the lensing grating structure.

In some aspects, a balanced photodetector can have two regions for measuring photons. In some aspects, the electronic signal can be indicative of the photons measured on the left side of the balanced photodetector minus the photons measured on the right side of the balanced photodetector. If no particle is present in a region scanned by a focused coherent radiation beam, the response on the balanced photodetector can be symmetric and thus the electronic signal can be substantially zero. If a focused coherent radiation beam scans a particle, a substantially non-zero electric signal can result. The balanced photodetector thus results in a higher signal-to-noise-ratio. In some aspects, a quadrant detector having four regions can be used instead of, or in addition to, a balanced photodetector. Four regions may be suitable if scans are performed in the X-direction (e.g., left-to-right difference) as well as in the Y-direction (e.g., top-to-bottom difference).

In one example, the lensing grating structure 510A can receive the coherent radiation from the radiation source 502, generate a first focused coherent radiation beam based on the coherent radiation, and transmit the first focused coherent radiation beam toward a first region of the surface of the substrate. In response to illuminating the first region with the first focused coherent radiation beam, the lensing grating structure 510A can receive photons scattered from the first region and transmit the received photons to the balanced photodetectors 512A. The balanced photodetector 512A can measure the photons received by each quadrant of the lensing grating structure 510A and generate a first electronic signal based on the measured photons.

In another example, the lensing grating structure 510B can receive the coherent radiation from the radiation source 502, generate a second focused coherent radiation beam based on the coherent radiation, and transmit the second focused coherent radiation beam toward a second region of the surface of the substrate. In response to illuminating the second region with the second focused coherent radiation beam, the lensing grating structure 510B can receive photons scattered from the second region and transmit the received photons to the balanced photodetectors 512B. The balanced photodetector 512B can measure the photons received by each quadrant of the lensing grating structure 510B and generate a second electronic signal based on the measured photons.

In yet another example, the lensing grating structure 510N can receive the coherent radiation from the radiation source 502, generate an N-th focused coherent radiation beam based on the coherent radiation (where N represents an integer value greater than two), and transmit the N-th focused coherent radiation beam toward an N-th region of the surface of the substrate. In response to illuminating the N-th region with the N-th focused coherent radiation beam, the lensing grating structure 510N can receive photons scattered from the N-th region and transmit the received photons to the balanced photodetectors 512N. The balanced photodetector 512N can measure the photons received by each quadrant of the lensing grating structure 510N and generate an N-th electronic signal based on the measured photons.

In some aspects, the controller can be electrically coupled to, and configured to receive electronic signals from, the balanced photodetectors 512A-512N. In some aspects, a respective region illuminated by a respective one of the lensing grating structures 510A-510N can include a particle, and the controller can be configured to detect the particle based on the electronic signal generated by a respective one of the balanced photodetectors 512A-512N.

In some aspects, the particle inspection system 500 can perform the detection by scanning a region of a substrate with one or more of the focused coherent radiation beams emitted by the lensing grating structures 510A-510N. If a particle is present, one or more of the electronic signals generated by the balanced photodetectors 512A-512N can change (e.g., become substantially non-zero in value), resulting in particle detection. For example, the particle inspection system 500 can scan, using the lensing grating structures 510A-510N, a regions on the surface of the substrate with the focused coherent radiation beams. The particle inspection system 500 then can measure, using the balanced photodetectors 512A-512N, the photons received by the lensing grating structures 510A-510N and generate electronic signals based on the measured photons. In some aspects, if an electronic signal is substantially zero in value, then the particle inspection system 500 can determine, using the controller, that the region corresponding to that electronic signal does not include a particle. In some aspects, if an electronic signal changes from substantially zero to substantially non-zero in value, then the particle inspection system 500 can determine, using the controller, that the region corresponding to that electronic signal includes a particle. Continuing the example, the particle inspection system 500 can detect, using the controller, a change (e.g. from zero to non-zero) in one or more electronic signals generated by the balanced photodetectors 512A-512N in response to illuminating the regions with the focused coherent radiation beams. Subsequently, the particle inspection system 500 can detect, using the controller, the particle in the region associated with the change in the one or more electronic signals.

In some aspects, the coherent radiation generated by the radiation source 502 can be visible light (e.g., having a wavelength of about 400 nm), and the particle inspection system 500 can detect, using the controller, particles having a size of less than about 100 nm, about 100 nm, or greater than about 100 nm (e.g., 0.2 µm, 0.5 µm, 1 µm, 10 µm, or any other suitable particle size). For example, the particle inspection system 500 can utilize a particle inspection technique that includes: (i) transmitting and receiving light through a high-NA objective; (ii) utilizing multiple k-vectors implemented by the lensing grating structures 510A-510N; and (iii) utilizing coherent light. This particle inspection technique can be particularly suited to detection of very small particles (e.g., less than about 100 nm, such as 50 nm, 40 nm, etc.). Further, the required source power for detection of small particles can be relatively low (e.g., compared to dark field inspection). For example, the expected dose per lensing grating structure for this particle inspection technique can be less than about 1.0 millijoule per square millimeter ($mJ/mm^2$).

In some aspects, incoming light (e.g., coherent radiation at 400 nm), provided by the radiation source 502, can be coupled into the chip via the fiber-to-grating coupling 506. The incoming light can reach the lensing grating structures 510A-510N via the waveguides 508A-508N, respectively. Each of the lensing grating structures 510A-510N can consist of a grating with variable line spacing so as to focus the light (e.g., "lensing"). Subsequently, the light scattered by the sample under inspection can be collected through the same lensing grating structure (e.g., waveguides in black relate to incoming light; waveguides in gray relate to scattered light). Each of the lensing grating structures 510A-510N can be separated into four regions to obtain a differential signal from the scattered light. Multiple lensing grating structures 510A-510N in parallel, provided in an array or checkerboard-like pattern, can allow inspection of a larger area in a single scanning movement.

Figure 6:
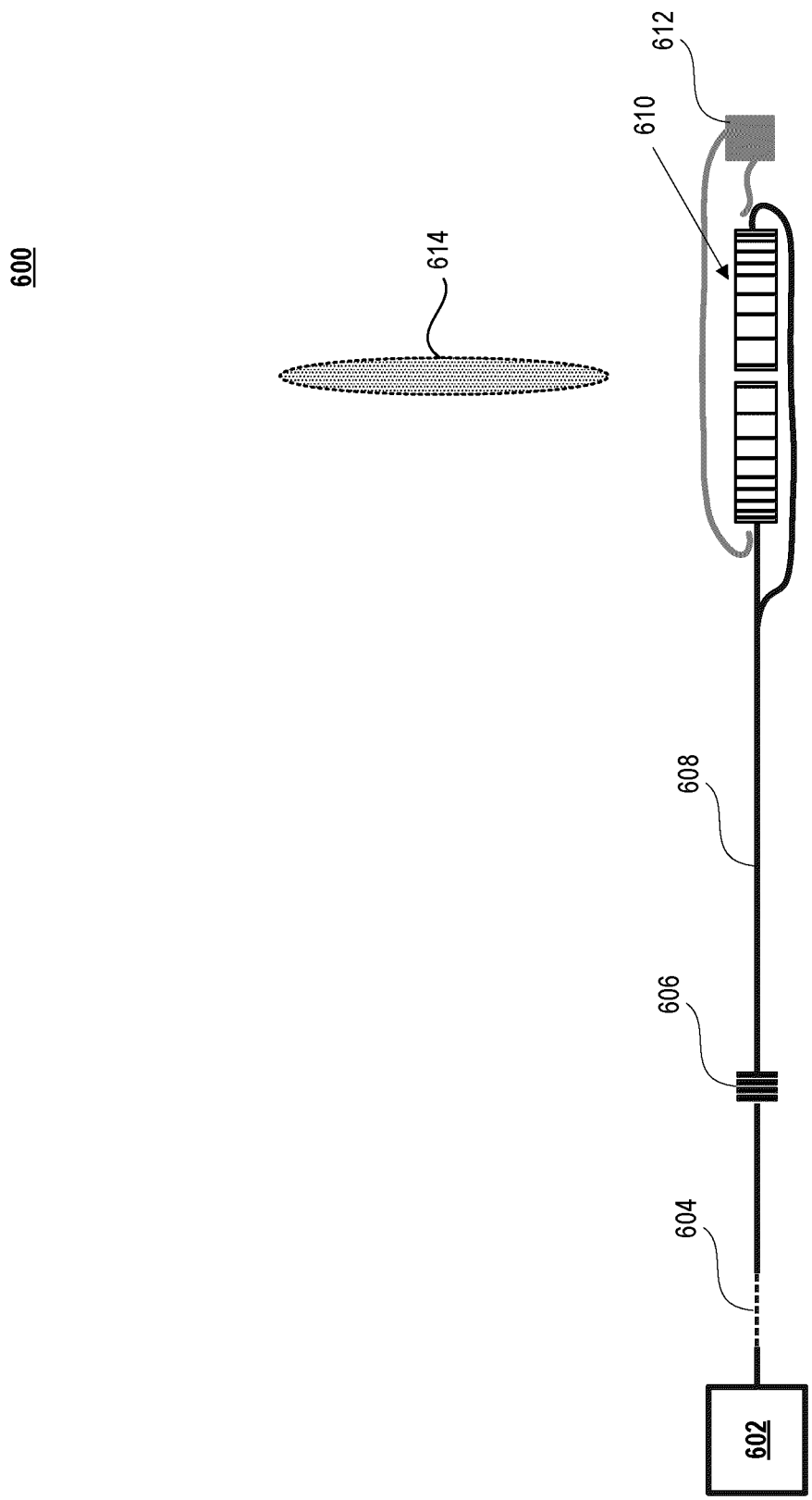
FIG. 6 is a schematic illustration of another example particle inspection system, according to some aspects of the present disclosure.

FIG. 6 is a schematic illustration showing a side view of a particle inspection system 600 according to some aspects of the present disclosure. In some aspects, the particle inspection system 600, or any portion thereof, can be implemented using any of the structures, components, features, or techniques described with reference to the particle inspection system 400 described with reference to FIG. 4; the particle inspection system 500 described with reference to FIG. 5; the example computing system 800 described with reference to FIG. 8; any of the systems, structures, components, features, or techniques described in U.S. Provisional Patent Application No. 63/043,543, filed Jun. 24, 2020, and titled "Self-Referencing Integrated Alignment Sensor," which is hereby incorporated by reference in its entirety; any other suitable structure, component, feature, or technique; any portion thereof; or any combination thereof.

As shown in FIG. 6, the particle inspection system 600 can include a radiation source 602 (e.g., a laser source), a fiber 604, a fiber-to-grating coupling 606, a waveguide 608, a lensing grating structure 610, a balanced photodetector 612, and a controller (not depicted). In some aspects, the particle inspection system 600 can be an integrated optics parallel inspection system. In some aspects, some, or all, of the components shown in FIG. 6 can be disposed in a single-chip, $Si_3N_4$-based particle inspection device. In one illustrative and non-limiting example, the fiber-to-grating coupling 606, the waveguide 608, the lensing grating structure 610, and the balanced photodetector 612 can be provided on a single chip.

The radiation source 602 can be configured to generate coherent radiation (e.g., having a wavelength of about 400 nm) and transmit the coherent radiation through the fiber 604 to the fiber-to-grating coupling 606 and the waveguide 608 to the lensing grating structure 610. The lensing grating structure 610 can be configured to receive the coherent radiation from the radiation source 602, generate a focused coherent radiation beam 614 based on the coherent radiation, and transmit the focused coherent radiation beam 614 toward a region of a surface of a substrate for use in particle inspection and other metrological techniques. In response to illuminating the region by the focused coherent radiation beam 614, the lensing grating structure 610 can be configured to receive photons scattered from the region and transmit the received photons to the balanced photodetector 612.

The balanced photodetector 612 can be optically coupled (e.g., via four channels such as waveguides) to each of the four quadrants of the lensing grating structure 610. The balanced photodetector 612 can be configured to measure the photons received by the lensing grating structure 610 and generate, based on the measured photons, an electronic signal for use in detecting a particle located in the region of the surface of the substrate. Additionally or alternatively, the balanced photodetector 612 can be configured to generate an optical signal based on the measured photons to allow for faster data processing. In some aspects, the lensing grating structure 610 can include a plurality of regions (e.g., four quadrants), and the balanced photodetector 612 can measure a plurality of sets of photons (e.g., four sets of photons) received by the plurality of regions (e.g., a first set of photons for the first quadrant, a second set of photons for the second quadrant, a third set of photons for the third quadrant, a fourth set of photons for the fourth quadrant) and generate the electronic signal based on the measured sets of photons, where each set of photons in the plurality of sets of photons has been received by a respective region of the lensing grating structure 610.

In some aspects, the balanced photodetector 612 can have two regions for measuring photons. In some aspects, the electronic signal can be indicative of the photons measured on the left side of the balanced photodetector 612 minus the photons measured on the right side of the balanced photodetector 612. If no particle is present in a region scanned by the focused coherent radiation beam 614, the response on the balanced photodetector 612 can be symmetric and thus the electronic signal can be substantially zero. If the focused coherent radiation beam 614 scans a particle, the response on the balanced photodetector 612 can be asymmetric and thus the electronic signal can be substantially non-zero. The balanced photodetector 612 thus results in a higher signal-to-noise-ratio. In some aspects, a quadrant detector having four regions can be used instead of, or in addition to, the balanced photodetector 612 (e.g., for two-dimensional scans performed in both the X-direction and the Y-direction).

In some aspects, the controller can be electrically coupled to, and configured to receive electronic signals from, the balanced photodetector 612. In some aspects, a region illuminated by the focused coherent radiation beam 614 can include a particle, and the controller can be configured to detect the particle based on the electronic signal generated by the balanced photodetector 612. In some aspects, the particle inspection system 600 can perform the detection by scanning a region of a substrate with the focused coherent radiation beam 614 emitted by the lensing grating structure 610. If a particle is present, the electronic signal generated by the balanced photodetector 612 can change (e.g., become substantially non-zero in value), resulting in particle detection.

In some aspects, the focused coherent radiation beam 614 generated by the lensing grating structure 610 can have a pencil-like beam shape, as shown in FIG. 6. In some aspects, a pencil-shaped beam can be created through use of a one-dimensional focusing element (e.g., grating structure), such that in one scanning movement a larger area is inspected. For example, the lensing grating structure 610 can be adjusted so as to act as a phased optical array, which can allow sideways movement of the focused coherent radiation beam 614 as it is scanned, and therefore can allow inspection of an even larger surface in a single scan.

In several embodiments, the particle inspection system 600 can include N lensing grating structures respectively coupled to N balanced photodetectors, where N represents an integer value greater than one, so as to allow parallel inspection achieving higher throughput. The N lensing grating structures can be, for example, aligned such that the pencil-shaped beams respectively generated by the N lensing grating structures overlap at their ends, so as to create a signal beam with larger length than the single beams. Additionally, the N lensing grating structures can be offset with respect to each other in the scanning direction to create, for example, a front-back-front-back-front-back pattern.

In one illustrative and non-limiting example, the lensing grating structure 610 can be an N-th lensing grating structure, and the balanced photodetector 612 can be an N-th balanced photodetector. The N-th lensing grating structure can receive the coherent radiation from the radiation source 602, generate an N-th focused coherent radiation beam based on the coherent radiation, and transmit the N-th focused coherent radiation beam toward an N-th region of the surface of the substrate. In response to illuminating the N-th region with the N-th focused coherent radiation beam, the N-th lensing grating structure can receive photons scattered from the N-th region and transmit the received photons to the N-th balanced photodetector. The N-th balanced photodetector can measure the photons received by each quadrant of the N-th lensing grating structure and generate an N-th electronic signal based on the measured photons.

Example Processes for Detecting a Particle

Figure 7:
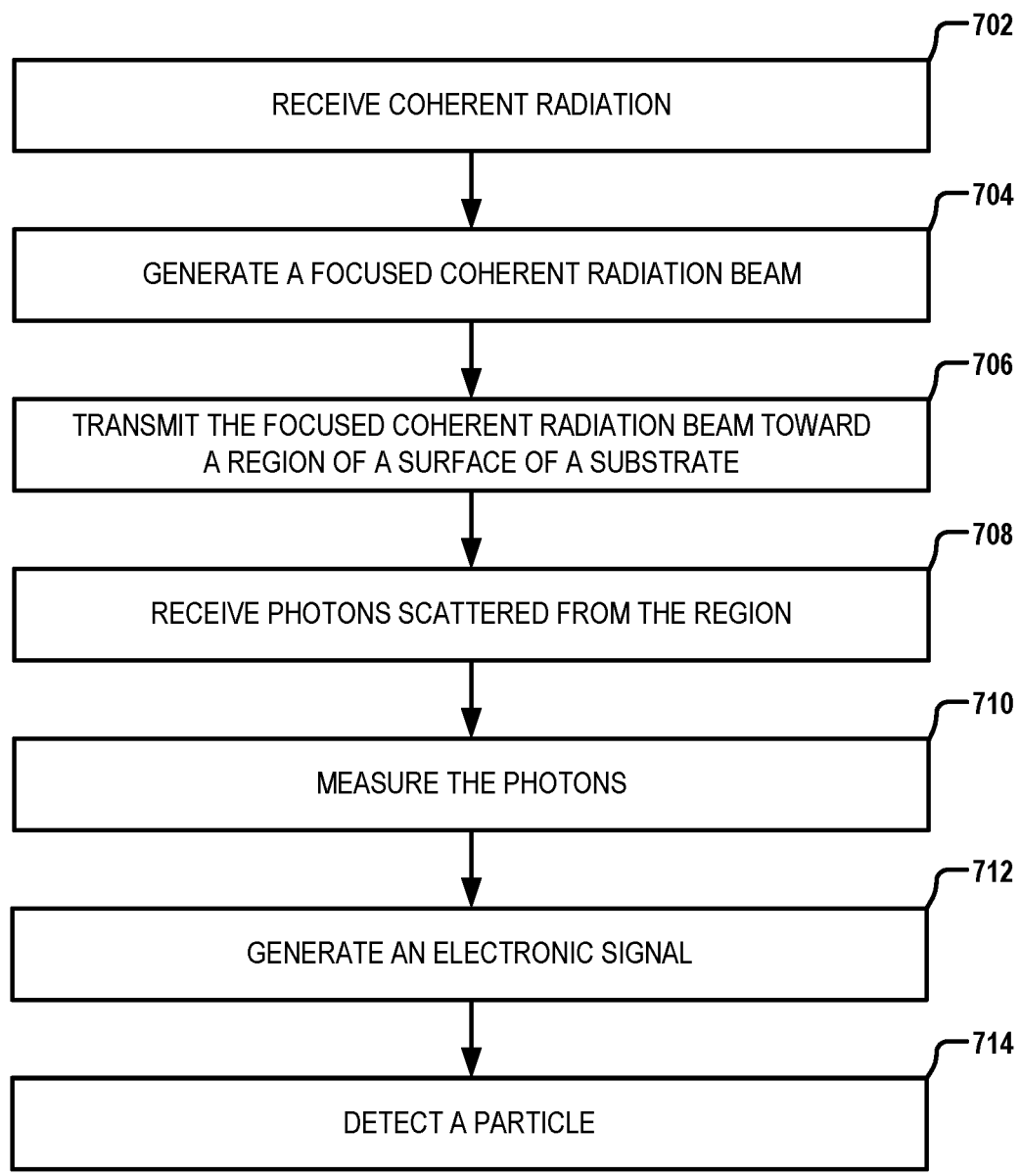
FIG. 7 is an example method for detecting a particle on a substrate surface according to some aspects of the present disclosure or portion(s) thereof.

FIG. 7 is an example method 700 for detecting a particle according to some aspects of the present disclosure or portion(s) thereof. The operations described with reference to example method 700 can be performed by, or according to, any of the systems, apparatuses, components, techniques, or combinations thereof described herein, such as those described with reference to FIGS. 1-6 above and FIG. 8 below.

At operation 702, the method can include receiving, by a grating structure (e.g., lensing grating structure 510A-510N, 610), coherent radiation from a radiation source (e.g., radiation source 502, 602). In some aspects, the receiving of the coherent radiation can be accomplished using suitable optical, electrical, mechanical, or other methods and include receiving the coherent radiation in accordance with any aspect or combination of aspects described with reference to FIGS. 1-6 above and FIG. 8 below.

At operation 704, the method can include generating, by the grating structure, a focused coherent radiation beam based on the coherent radiation. In some aspects, the generating of the focused coherent radiation beam can include generating, by the grating structure, the focused coherent radiation beam having a pencil-like beam shape (e.g., as depicted in FIG. 6 with reference to focused coherent radiation beam 614). In some aspects, the generating of the focused coherent radiation beam can be accomplished using suitable optical, electrical, mechanical, or other methods and include generating the focused coherent radiation beam in accordance with any aspect or combination of aspects described with reference to FIGS. 1-6 above and FIG. 8 below.

At operation 706, the method can include transmitting, by the grating structure, the focused coherent radiation beam toward a region of a surface of a substrate (e.g., illuminating the region with the focused coherent radiation beam). In some aspects, the transmitting of the focused coherent radiation beam can be accomplished using suitable optical, electrical, mechanical, or other methods and include transmitting the focused coherent radiation beam in accordance with any aspect or combination of aspects described with reference to FIGS. 1-6 above and FIG. 8 below.

At operation 708, the method can include receiving, by the grating structure, photons scattered from the region in response to illuminating the region with the focused coherent radiation beam. In some aspects, the receiving of the photons can be accomplished using suitable optical, electrical, mechanical, or other methods and include receiving the photons in accordance with any aspect or combination of aspects described with reference to FIGS. 1-6 above and FIG. 8 below.

At operation 710, the method can include measuring, by a photodetector (e.g., balanced photodetector 512A-512N, 612), the photons received by the grating structure. In some aspects, the measuring of the photons can be accomplished using suitable optical, electrical, mechanical, or other methods and include measuring the photons in accordance with any aspect or combination of aspects described with reference to FIGS. 1-6 above and FIG. 8 below.

At operation 712, the method can include generating, by the photodetector and based on the measured photons, an electronic signal for use in detecting a particle located in the region of the surface of the substrate. Additionally or alternatively, the method can include generating, by the photodetector, an optical signal based on the measured photons to allow for faster data processing. In some aspects, the generating of the electronic signal or optical signal can be accomplished using suitable optical, electrical, mechanical, or other methods and include generating the electronic signal in accordance with any aspect or combination of aspects described with reference to FIGS. 1-6 above and FIG. 8 below.

At operation 714, the method can include detecting, by a controller (e.g., controller 430, example computing system 800), a particle in the region based on the electronic signal. For example, the region can include a particle, and the method can further include: scanning, by the grating structure, the surface of the substrate with the focused coherent radiation beam; detecting, by the controller, a change in the electronic signal in response to illuminating the region with the focused coherent radiation beam; and detecting, by the controller, the particle based on the change in the electronic signal. In some aspects, the coherent radiation can have a wavelength of about 400 nm, and a size of the detected particle can be less than about 100 nm. In some aspects, the detecting of the particle can be accomplished using suitable optical, electrical, mechanical, or other methods and include detecting the particle in accordance with any aspect or combination of aspects described with reference to FIGS. 1-6 above and FIG. 8 below.

Optionally, in some aspects, the grating structure can include a plurality of regions, and the method can further include: receiving, by the plurality of regions of the grating structure, a plurality of sets of photons scattered from the region in response to illuminating the region with the focused coherent radiation beam; measuring, by the photodetector, the plurality of sets of photons received by the plurality of regions, and generating, by the photodetector, the electronic signal based on the measured plurality of sets of photons. In such aspects, the plurality of sets of photons can include the photons measured at operation 710, and each set of photons in the plurality of sets of photons can have been received by a respective region of the grating structure.

Optionally, in some aspects, the method can further include: receiving, by each grating structure in a plurality of grating structures that includes the grating structure, a respective portion of the coherent radiation from the radiation source; generating, by each grating structure in the plurality of grating structures, a respective focused coherent radiation beam based on the respective portion of the coherent radiation; transmitting, by each grating structure in the plurality of grating structures, the respective focused coherent radiation beam toward a respective region of the surface of the substrate; receiving, by each grating structure in the plurality of grating structures, respective photons scattered from the respective region in response to illuminating the respective region with the respective focused coherent radiation beam; measuring, by each photodetector in a plurality of photodetectors that includes the photodetector, the respective photons received by the respective grating structure; and generating, by each photodetector in the plurality of photodetectors and based on the measured photons, a respective electronic signal for use in detecting a particle located in the region of the surface of the substrate.

Example Computing System

Aspects of the disclosure can be implemented in hardware, firmware, software, or any combination thereof. Aspects of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others. Further, firmware, software, routines, instructions, and combinations thereof can be described herein as performing certain actions. However, it should be appreciated that such descriptions are merely for convenience and that such actions in fact result from computing devices, processors, controllers, or other devices executing the firmware, software, routines, instructions, or combinations thereof and, in doing so, causing actuators or other devices (e.g., servo motors, robotic devices) to interact with the physical world.

Figure 8:
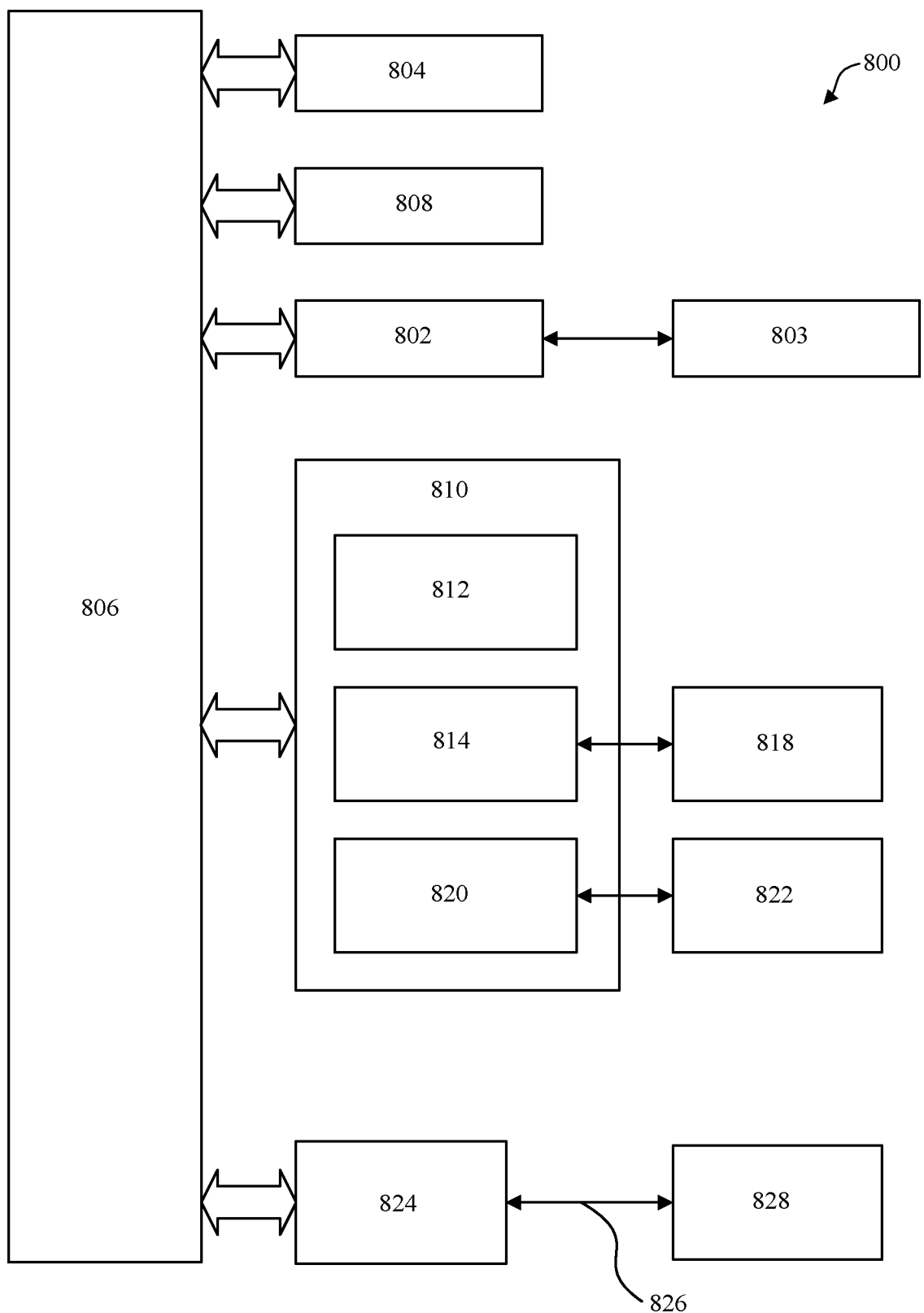
FIG. 8 is an example computer system for implementing some aspects of the present disclosure or portion(s) thereof.

Various aspects can be implemented, for example, using one or more computing systems, such as example computing system 800 shown in FIG. 8. Example computing system 800 can be a specialized computer capable of performing the functions described herein such as: the particle inspection system 400 described with reference to FIG. 4; the particle inspection system 500 described with reference to FIG. 5; the particle inspection system 600 described with reference to FIG. 6; any other suitable system, sub-system, or component; or any combination thereof. Example computing system 800 can include one or more processors (also called central processing units, or CPUs), such as a processor 804. Processor 804 is connected to a communication infrastructure 806 (e.g., a bus). Example computing system 800 can also include user input/output device(s) 803, such as monitors, keyboards, pointing devices, etc., that communicate with communication infrastructure 806 through user input/output interface(s) 802. Example computing system 800 can also include a main memory 808 (e.g., one or more primary storage devices), such as random access memory (RAM). Main memory 808 can include one or more levels of cache. Main memory 808 has stored therein control logic (e.g., computer software) and/or data.

Example computing system 800 can also include a secondary memory 810 (e.g., one or more secondary storage devices). Secondary memory 810 can include, for example, a hard disk drive 812 and/or a removable storage drive 814. Removable storage drive 814 can be a floppy disk drive, a magnetic tape drive, a compact disk drive, an optical storage device, tape backup device, and/or any other storage device/drive.

Removable storage drive 814 can interact with a removable storage unit 818. Removable storage unit 818 includes a computer usable or readable storage device having stored thereon computer software (control logic) and/or data. Removable storage unit 818 can be a floppy disk, magnetic tape, compact disk, DVD, optical storage disk, and/or any other computer data storage device. Removable storage drive 814 reads from and/or writes to removable storage unit 818.

According to some aspects, secondary memory 810 can include other means, instrumentalities or other approaches for allowing computer programs and/or other instructions and/or data to be accessed by example computing system 800. Such means, instrumentalities or other approaches can include, for example, a removable storage unit 822 and an interface 820. Examples of the removable storage unit 822 and the interface 820 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Example computing system 800 can further include a communications interface 824 (e.g., one or more network interfaces). Communications interface 824 enables example computing system 800 to communicate and interact with any combination of remote devices, remote networks, remote entities, etc. (individually and collectively referred to as remote devices 828). For example, communications interface 824 can allow example computing system 800 to communicate with remote devices 828 over communications path 826, which can be wired and/or wireless, and which can include any combination of LANs, WANs, the Internet, etc. Control logic, data, or both can be transmitted to and from example computing system 800 via communications path 826.

The operations in the preceding aspects of the present disclosure can be implemented in a wide variety of configurations and architectures. Therefore, some or all of the operations in the preceding aspects can be performed in hardware, in software or both. In some aspects, a tangible, non-transitory apparatus or article of manufacture includes a tangible, non-transitory computer useable or readable medium having control logic (software) stored thereon is also referred to herein as a computer program product or program storage device. This includes, but is not limited to, example computing system 800, main memory 808, secondary memory 810 and removable storage units 818 and 822, as well as tangible articles of manufacture embodying any combination of the foregoing. Such control logic, when executed by one or more data processing devices (such as example computing system 800), causes such data processing devices to operate as described herein.

Based on the teachings contained in this disclosure, it will be apparent to persons skilled in the relevant art(s) how to make and use aspects of the disclosure using data processing devices, computer systems and/or computer architectures other than that shown in FIG. 8. In particular, aspects of the disclosure can operate with software, hardware, and/or operating system implementations other than those described herein.

The embodiments may further be described using the following clauses:

1. A system, comprising:
   a radiation source configured to generate coherent radiation;
   a grating structure optically coupled to the radiation source and configured to:
      receive the coherent radiation from the radiation source,
      generate a focused coherent radiation beam based on the coherent radiation,
      transmit the focused coherent radiation beam toward a region of a surface of a substrate, and
      receive photons scattered from the region in response to an illumination of the region by the focused coherent radiation beam; and
   a photodetector optically coupled to the grating structure and configured to:
      measure the photons received by the grating structure, and
      generate an electronic signal based on the measured photons.

2. The system of clause 1, wherein:
   the region comprises a particle; and
   the system further comprises a controller coupled to the photodetector and configured to:
      receive the electronic signal from the photodetector, and
      detect the particle based on the electronic signal.

3. The system of clause 2, wherein:
   the radiation source comprises a laser source configured to generate the coherent radiation;
   the coherent radiation has a wavelength of about 400 nanometers; and
   a size of the particle is less than about 100 nanometers.

4. The system of clause 1, wherein:
   the grating structure comprises a plurality of regions;
   the photodetector is configured to:
      measure a plurality of sets of photons received by the plurality of regions, and
      generate the electronic signal based on the measured plurality of sets of photons;
   the plurality of sets of photons comprises the photons; and
   each set of photons in the plurality of sets of photons has been received by a respective region of the grating structure.

5. The system of clause 4, wherein:
   the grating structure is a lensing grating structure comprising four quadrants;
   each region in the plurality of regions corresponds to a respective quadrant of the lensing grating structure; and
   the photodetector is a balanced photodetector that is coupled to each quadrant of the lensing grating structure through a respective channel.

6. The system of clause 1, further comprising:
   a plurality of grating structures comprising the grating structure, wherein each grating structure in the plurality of grating structures is optically coupled to the radiation source and configured to:
      receive a respective portion of the coherent radiation from the radiation source,
      generate a respective focused coherent radiation beam based on the respective portion of the coherent radiation,
      transmit the respective focused coherent radiation beam toward a respective region of the surface of the substrate, and
      receive respective photons scattered from the respective region in response to a respective illumination of the respective region by the respective focused coherent radiation beam; and
   a plurality of photodetectors comprising the photodetector, wherein each photodetector in the plurality of photodetectors is optically coupled to a respective grating structure and configured to:
      measure the respective photons received by the respective grating structure, and
      generate a respective electronic signal based on the measured respective photons.

7. The system of clause 1, wherein the grating structure is configured to generate the focused coherent radiation beam having a pencil-like beam shape.

8. A monolithic inspection device, comprising:
   a receiver configured to receive coherent radiation from a radiation source;
   a focusing structure optically coupled to the receiver and configured to:
      generate a focused coherent radiation beam based on the coherent radiation,
      transmit the focused coherent radiation beam toward a region of a surface of a substrate, and
      receive photons scattered from the region in response to an illumination of the region by the focused coherent radiation beam; and
   a photodetector optically coupled to the focusing structure and configured to:
      measure the photons received by the focusing structure, and
      generate an electronic signal based on the measured photons.

9. The monolithic inspection device of clause 8, wherein:
   the region comprises a particle; and
   the monolithic inspection device further comprises a controller coupled to the photodetector and configured to:
      receive the electronic signal from the photodetector, and
      detect the particle based on the electronic signal.

10. The monolithic inspection device of clause 9, wherein:
   the coherent radiation has a wavelength of about 400 nanometers; and
   a size of the particle is less than about 100 nanometers.

11. The monolithic inspection device of clause 8, wherein:
   the focusing structure comprises a plurality of regions;
   the photodetector is configured to:
      measure a plurality of sets of photons received by the plurality of regions, and
      generate the electronic signal based on the measured plurality of sets of photons;
   the plurality of sets of photons comprises the photons; and
   each set of photons in the plurality of sets of photons has been received by a respective region of the focusing structure.

12. The monolithic inspection device of clause 11, wherein:
   the focusing structure is a lensing grating structure comprising four quadrants;
   each region in the plurality of regions corresponds to a respective quadrant of the lensing grating structure; and
   the photodetector is a balanced photodetector that is coupled to each quadrant of the lensing grating structure through a respective channel.

13. The monolithic inspection device of clause 8, further comprising:
   a plurality of focusing structures comprising the focusing structure, wherein each focusing structure in the plurality of focusing structures is optically coupled to the radiation source and configured to:
      receive a respective portion of the coherent radiation from the radiation source,
      generate a respective focused coherent radiation beam based on the respective portion of the coherent radiation,
      transmit the respective focused coherent radiation beam toward a respective region of the surface of the substrate, and
      receive respective photons scattered from the respective region in response to a respective illumination of the respective region by the respective focused coherent radiation beam; and
   a plurality of photodetectors comprising the photodetector, wherein each photodetector in the plurality of photodetectors is optically coupled to a respective focusing structure and configured to:
      measure the respective photons received by the respective focusing structure, and
      generate a respective electronic signal based on the measured respective photons.

14. The monolithic inspection device of clause 8, wherein the focusing structure is configured to generate the focused coherent radiation beam having a pencil-like beam shape.

15. A method, comprising:
   receiving, by a grating structure, coherent radiation from a radiation source;
   generating, by the grating structure, a focused coherent radiation beam based on the coherent radiation;
   transmitting, by the grating structure, the focused coherent radiation beam toward a region of a surface of a substrate;
   receiving, by the grating structure, photons scattered from the region in response to illuminating the region with the focused coherent radiation beam;
   measuring, by a photodetector, the photons received by the grating structure; and
   generating, by the photodetector, an electronic signal based on the measured photons.

16. The method of clause 15, wherein:
   the region comprises a particle; and
   the method further comprises:
      scanning, by the grating structure, the surface of the substrate with the focused coherent radiation beam;
      detecting, by a controller, a change in the electronic signal in response to illuminating the region with the focused coherent radiation beam; and
      detecting, by the controller, the particle based on the change in the electronic signal.

17. The method of clause 16, wherein:
   the coherent radiation has a wavelength of about 400 nanometers; and
   a size of the particle is less than about 100 nanometers.

18. The method of clause 15, wherein:
   the grating structure comprises a plurality of regions;
   the method further comprises:
      receiving, by the plurality of regions of the grating structure, a plurality of sets of photons scattered from the region in response to illuminating the region with the focused coherent radiation beam;
      measuring, by the photodetector, the plurality of sets of photons received by the plurality of regions, and
      generating, by the photodetector, the electronic signal based on the measured plurality of sets of photons;
   the plurality of sets of photons comprises the photons; and
   each set of photons in the plurality of sets of photons has been received by a respective region of the grating structure.

19. The method of clause 15, further comprising:
   receiving, by each grating structure in a plurality of grating structures that comprises the grating structure, a respective portion of the coherent radiation from the radiation source;

generating, by each grating structure in the plurality of grating structures, a respective focused coherent radiation beam based on the respective portion of the coherent radiation;

transmitting, by each grating structure in the plurality of grating structures, the respective focused coherent radiation beam toward a respective region of the surface of the substrate;

receiving, by each grating structure in the plurality of grating structures, respective photons scattered from the respective region in response to illuminating the respective region with the respective focused coherent radiation beam;

measuring, by each photodetector in a plurality of photodetectors that comprises the photodetector, the respective photons received by the respective grating structure; and generating, by each photodetector in the plurality of photodetectors, a respective electronic signal based on the measured respective photons.

20. The method of clause 15, wherein the generating the focused coherent radiation beam comprises generating, by the grating structure, the focused coherent radiation beam having a pencil-like beam shape.

Although specific reference may be made in this text to the use of lithographic apparatus in the manufacture of ICs, it should be understood that the lithographic apparatuses described herein can have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein can be processed, before or after exposure, in for example a particle inspection unit, a track unit (a tool that applies a layer of resist to a substrate and develops the exposed resist), a metrology unit, or a combination thereof. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself can be patterned and materials added on top of it can also be patterned, or can remain without patterning.

The examples disclosed herein are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

While specific aspects of the disclosure have been described above, it will be appreciated that the aspects can be practiced otherwise than as described. The description is not intended to limit the embodiments of the disclosure.

It is to be appreciated that the Detailed Description section, and not the Background, Summary, and Abstract sections, is intended to be used to interpret the claims. The Summary and Abstract sections may set forth one or more but not all example embodiments as contemplated by the inventor(s), and thus, are not intended to limit the present embodiments and the appended claims in any way.

Some aspects of the disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects of the disclosure will so fully reveal the general nature of the aspects that others can, by applying knowledge within the skill of the art, readily modify and/or adapt for various applications such specific aspects, without undue experimentation, without departing from the general concept of the present disclosure. Therefore, such adaptations and modifications are intended to be within the meaning and range of equivalents of the disclosed aspects, based on the teaching and guidance presented herein.

The breadth and scope of the present disclosure should not be limited by any of the above-described example aspects or embodiments, but should be defined only in accordance with the following claims and their equivalents.

The invention claimed is:

1. A system, comprising:
a radiation source configured to generate coherent radiation;
a grating structure optically coupled to the radiation source and configured to:
receive the coherent radiation from the radiation source,
generate a focused coherent radiation beam based on the coherent radiation,
transmit the focused coherent radiation beam toward a region of a surface of a substrate, wherein the grating structure comprises a grating with variable line spacing and is coupled to the radiation source via a waveguide, and
receive photons scattered from the region in response to an illumination of the region by the focused coherent radiation beam; and
a photodetector optically coupled to the grating structure and configured to:
measure the photons received by the grating structure, and
generate an electronic signal based on the measured photons.

2. The system of claim 1, wherein:
the region comprises a particle; and
the system further comprises a controller coupled to the photodetector and configured to:
receive the electronic signal from the photodetector, and
detect the particle based on the electronic signal.

3. The system of claim 2, wherein:
the radiation source comprises a laser source configured to generate the coherent radiation;
the coherent radiation has a wavelength of about 400 nanometers; and
a size of the particle is less than about 100 nanometers.

4. The system of claim 1, wherein:
the grating structure comprises a plurality of regions;
the photodetector is configured to:

measure a plurality of sets of photons received by the plurality of regions, and
generate the electronic signal based on the measured plurality of sets of photons;
the plurality of sets of photons comprises the photons; and
each set of photons in the plurality of sets of photons has been received by a respective region of the grating structure.

5. The system of claim 4, wherein:
the grating structure is a lensing grating structure comprising four quadrants;
each region in the plurality of regions corresponds to a respective quadrant of the lensing grating structure; and
the photodetector is a balanced photodetector that is coupled to each quadrant of the lensing grating structure through a respective channel.

6. The system of claim 1, further comprising:
a plurality of grating structures comprising the grating structure, wherein each grating structure in the plurality of grating structures is optically coupled to the radiation source and configured to:
receive a respective portion of the coherent radiation from the radiation source,
generate a respective focused coherent radiation beam based on the respective portion of the coherent radiation,
transmit the respective focused coherent radiation beam toward a respective region of the surface of the substrate, and
receive respective photons scattered from the respective region in response to a respective illumination of the respective region by the respective focused coherent radiation beam; and
a plurality of photodetectors comprising the photodetector, wherein each photodetector in the plurality of photodetectors is optically coupled to a respective grating structure and configured to:
measure the respective photons received by the respective grating structure, and
generate a respective electronic signal based on the measured respective photons.

7. The system of claim 1, wherein the grating structure is configured to generate the focused coherent radiation beam having a pencil-like beam shape.

8. A method, comprising:
receiving, by a grating structure, coherent radiation from a radiation source via a waveguide coupled to the radiation source, wherein the grating structure comprises a grating with variable line spacing;
generating, by the grating structure, a focused coherent radiation beam based on the coherent radiation;
transmitting, by the grating structure, the focused coherent radiation beam toward a region of a surface of a substrate;
receiving, by the grating structure, photons scattered from the region in response to illuminating the region with the focused coherent radiation beam;
measuring, by a photodetector, the photons received by the grating structure; and
generating, by the photodetector, an electronic signal based on the measured photons.

9. The method of claim 8, wherein:
the region comprises a particle; and
the method further comprises:
scanning, by the grating structure, the surface of the substrate with the focused coherent radiation beam;
detecting, by a controller, a change in the electronic signal in response to illuminating the region with the focused coherent radiation beam; and
detecting, by the controller, the particle based on the change in the electronic signal.

10. The method of claim 9, wherein:
the coherent radiation has a wavelength of about 400 nanometers; and
a size of the particle is less than about 100 nanometers.

11. The method of claim 8, wherein:
the grating structure comprises a plurality of regions;
the method further comprises:
receiving, by the plurality of regions of the grating structure, a plurality of sets of photons scattered from the region in response to illuminating the region with the focused coherent radiation beam;
measuring, by the photodetector, the plurality of sets of photons received by the plurality of regions, and
generating, by the photodetector, the electronic signal based on the measured plurality of sets of photons;
the plurality of sets of photons comprises the photons; and
each set of photons in the plurality of sets of photons has been received by a respective region of the grating structure.

12. The method of claim 8, further comprising:
receiving, by each grating structure in a plurality of grating structures that comprises the grating structure, a respective portion of the coherent radiation from the radiation source;
generating, by each grating structure in the plurality of grating structures, a respective focused coherent radiation beam based on the respective portion of the coherent radiation;
transmitting, by each grating structure in the plurality of grating structures, the respective focused coherent radiation beam toward a respective region of the surface of the substrate;
receiving, by each grating structure in the plurality of grating structures, respective photons scattered from the respective region in response to illuminating the respective region with the respective focused coherent radiation beam;
measuring, by each photodetector in a plurality of photodetectors that comprises the photodetector, the respective photons received by the respective grating structure; and
generating, by each photodetector in the plurality of photodetectors, a respective electronic signal based on the measured respective photons.

13. The method of claim 8, wherein the generating the focused coherent radiation beam comprises generating, by the grating structure, the focused coherent radiation beam having a pencil-like beam shape.

* * * * *

UNITED STATES PATENT AND TRADEMARK OFFICE
CERTIFICATE OF CORRECTION

Page 1 of 1

PATENT NO. : 12,298,257 B2
APPLICATION NO. : 18/012801
DATED : May 13, 2025
INVENTOR(S) : Van Weperen et al.

It is certified that error appears in the above-identified patent and that said Letters Patent is hereby corrected as shown below:

In the Specification

In Column 10, Line 7, delete "PS" and replace with --PS.--.

Signed and Sealed this
Seventeenth Day of June, 2025

Coke Morgan Stewart
*Acting Director of the United States Patent and Trademark Office*